US006896775B2

(12) United States Patent
Chistyakov

(10) Patent No.: US 6,896,775 B2
(45) Date of Patent: May 24, 2005

(54) HIGH-POWER PULSED MAGNETICALLY ENHANCED PLASMA PROCESSING

(75) Inventor: Roman Chistyakov, Andover, MA (US)

(73) Assignee: Zond, Inc., Mansfield, MA (US)

( * ) Notice: Subject to any disclaimer, the term of this patent is extended or adjusted under 35 U.S.C. 154(b) by 386 days.

(21) Appl. No.: 10/065,551

(22) Filed: Oct. 29, 2002

(65) Prior Publication Data

US 2004/0082187 A1 Apr. 29, 2004

(51) Int. Cl.[7] .......................... C23C 14/34; C23F 1/00
(52) U.S. Cl. ........................ 204/192.32; 204/298.31; 204/298.33; 204/298.34; 204/298.37; 216/67; 216/71; 156/345.43; 156/345.44; 156/345.46
(58) Field of Search ................ 204/192.32, 298.31, 204/298.33, 298.34, 298.37; 216/67, 71; 156/345.43, 345.44, 345.46

(56) References Cited

U.S. PATENT DOCUMENTS

| | | | |
|---|---|---|---|
| 4,588,490 A | 5/1986 | Cuomo et al. ............. 204/298 |
| 4,983,253 A | 1/1991 | Wolfe et al. | |
| 5,083,061 A | 1/1992 | Koshiishi et al. ........ 315/111.81 |
| 5,728,261 A | 3/1998 | Wolfe et al. | |
| 5,728,278 A | 3/1998 | Okamura et al. ........ 204/298.11 |
| 5,795,452 A | 8/1998 | Kinoshita et al. ....... 204/298.37 |
| 6,057,244 A | 5/2000 | Hausmann et al. ......... 438/706 |
| 6,447,691 B1 | 9/2002 | Denda et al. ............... 216/61 |
| 6,451,703 B1 | 9/2002 | Liu et al. .................. 438/710 |
| 6,471,833 B2 | 10/2002 | Kumar et al. ........... 204/192.37 |
| 2002/0019139 A1 | 2/2002 | Zhang et al. ............... 438/714 |
| 2002/0114897 A1 | 8/2002 | Sumiya et al. ............. 427/569 |
| 2003/0006008 A1 | 1/2003 | Horioka et al. ......... 156/345.46 |

FOREIGN PATENT DOCUMENTS

EP  0428 161 A2  5/1991
WO  WO 98/40532  9/1998
WO  WO 01/98553 A1  12/2001

OTHER PUBLICATIONS

US 5,863,392, 1/1999, Drummond et al. (withdrawn)
Encyclopedia Of Low Temperature Plasma, p. 119, vol. 3.
Encyclopedia Of Low Temperature Plasma, p. 123, vol. 3.
Chistyakov, High–Power Pulsed Magnetron Sputtering, U.S. Appl. No.: 10/065,277, Filed: Sep. 30, 2002.
Chistyakov, Roman, High–Power Pulsed Magnetron Sputtering, U.S. Appl. No.: 10/065,277, Filed: Sep. 30, 2002.
Booth, et al., The Transition From Symmetric To Asymmetric Discharges In Pulsed 13.56 MHz Capacity Coupled Plasmas, J. Appl. Phys., Jul. 15, 1997, pp. 552–560, vol. 82 (2), American Institute of Physics.

(Continued)

Primary Examiner—Rodney G. McDonald
(74) Attorney, Agent, or Firm—Kurt Rauschenbach; Rauschenbach Patent Law Group, LLC

(57) ABSTRACT

Magnetically enhanced plasma processing methods and apparatus are described. A magnetically enhanced plasma processing apparatus according to the present invention includes an anode and a cathode that is positioned adjacent to the anode. An ionization source generates a weakly-ionized plasma proximate to the cathode. A magnet is positioned to generate a magnetic field proximate to the weakly-ionized plasma. The magnetic field substantially traps electrons in the weakly-ionized plasma proximate to the cathode. A power supply produces an electric field in a gap between the anode and the cathode. The electric field generates excited atoms in the weakly-ionized plasma and generates secondary electrons from the cathode. The secondary electrons ionize the excited atoms, thereby creating a strongly-ionized plasma. A voltage supply applies a bias voltage to a substrate that is positioned proximate to the cathode that causes ions in the plurality of ions to impact a surface of the substrate in a manner that causes etching of the surface of the substrate.

37 Claims, 18 Drawing Sheets

OTHER PUBLICATIONS

Bunshah, et al., Deposition Technologies For Films And Coatings, Materials Science Series, pp. 176–183, Noyes Publications, Park Ridge, New Jersey.

Daugherty, et al., Attachment–Dominated Electron–Beam–Ionized Discharges, Applied Science Letters, May 15, 1976, vol. 28, No. 10, American Institute of Physics.

Goto, et al., Dual Excitation Reactive Ion Etcher for Low Energy Plasma Processing, J. Vac. Sci. Technol. A, Sep./Oct. 1992, pp. 3048–3054, vol. 10, No. 5, American Vacuum Society.

Kouznetsov, et al., A Novel Pulsed Magnetron Sputter Technique Utilizing Very High Target Power Densities, Surface & Coatings Technology, pp. 290–293, Elsevier Sciences S.A.

Lindquist, et al., High Selectivity Plasma Etching Of Silicon Dioxide With A Dual Frequency 27/2 MHz Capacitive RF Discharge.

Macak, Reactive Sputter Deposition Process of Al2O3 and Characterization Of A Novel High Plasma Density Pulsed Magnetron Discharge, Linkoping Studies In Science And Technology, 1999, pp. 1–2, Sweden.

Macak, et al., Ionized Sputter Deposition Using An Extremely High Plasma Density Pulsed Magnetron Discharge, J. Vac Sci. Technol. A., Jul./Aug. 2000, pp. 1533–1537, vol. 18, No. 4, American Vacuum Society.

Mozgrin, et al., High–Current Low–Pressure Quasi –Stationary Discharge In A Magnetic Field: Experimental Research, Plasma Physics Reports, 1995, pp. 400–409, vol. 21, No. 5, Mozgrin, Feitsov, Khodachenko.

Rossnagel, et al., Induced Drift Currents In Circular Planar Magnetrons, J. Vac. Sci. Technol. A., Jan./Feb. 1987, pp. 88–91, vol. 5, No. 1, American Vacuum Society.

Sheridan, et al., Electron Velocity Distribution Functions In A Sputtering Magnetron Discharge For The EXB Direction, J. Vac. Sci. Technol. A., Jul./Aug. 1998, pp. 2173–2176, vol. 16, No. 4, American Vacuum Society.

Steinbruchel, A Simple Formula For Low–Energy Sputtering Yields, Applied Physics A., 1985, pp. 37–42, vol. 36, Springer–Verlag.

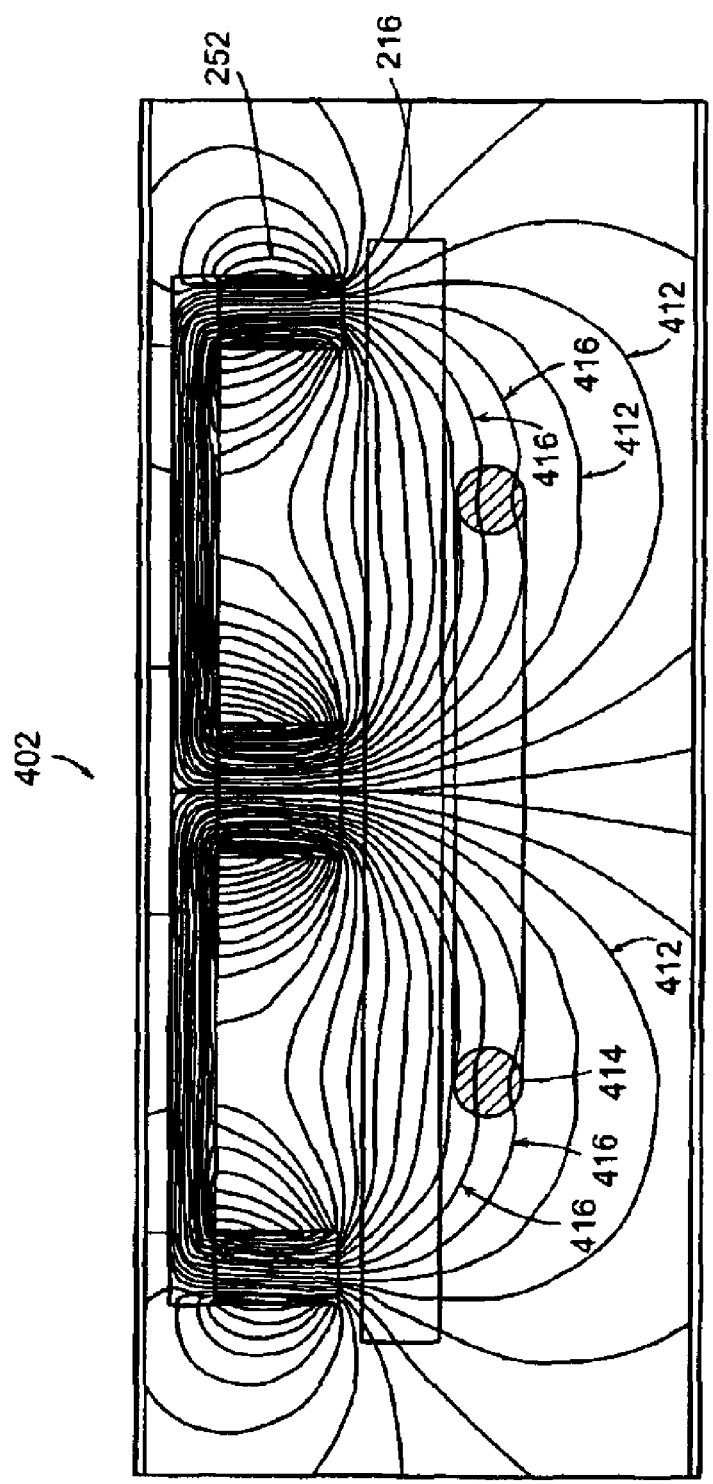

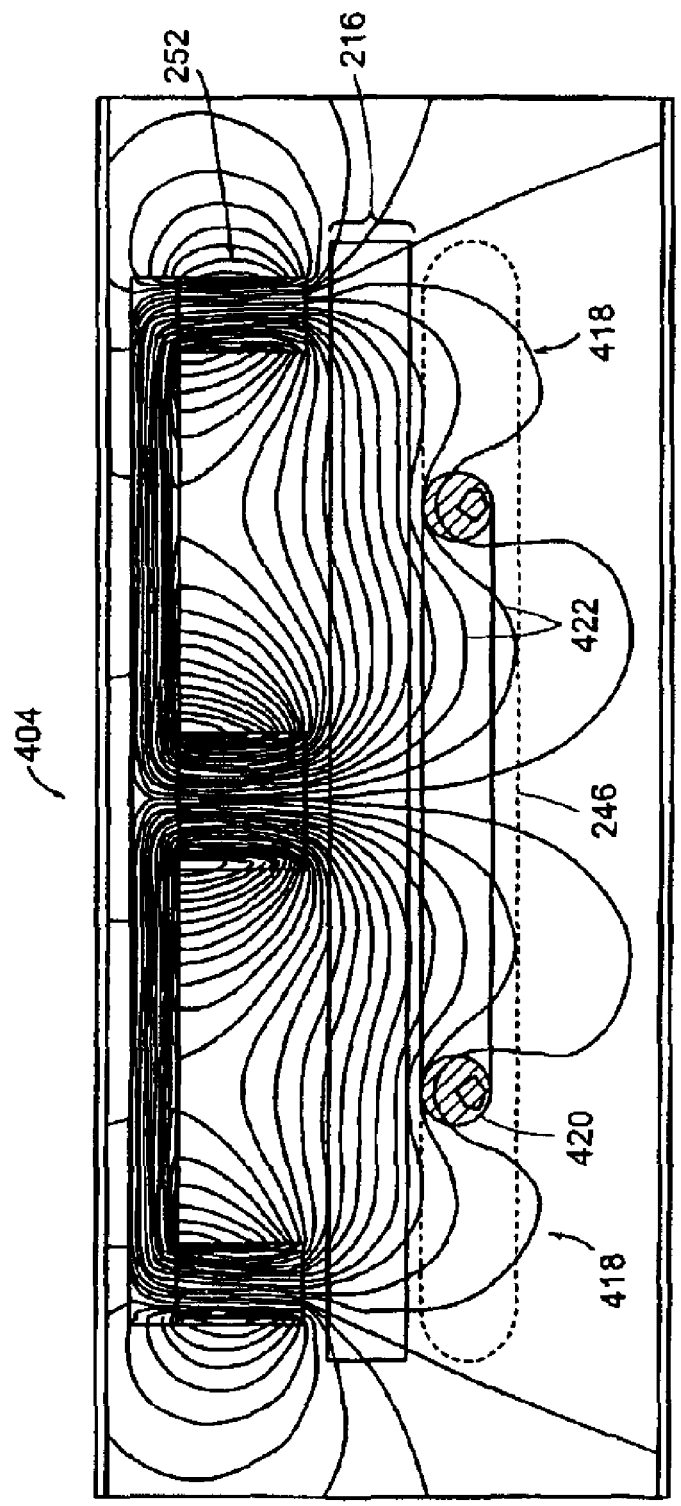

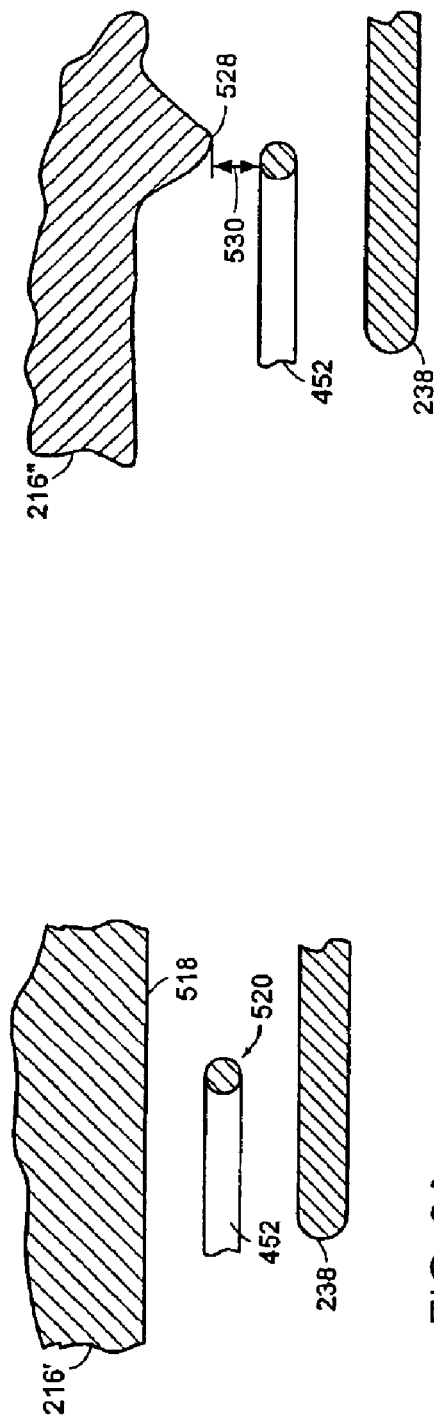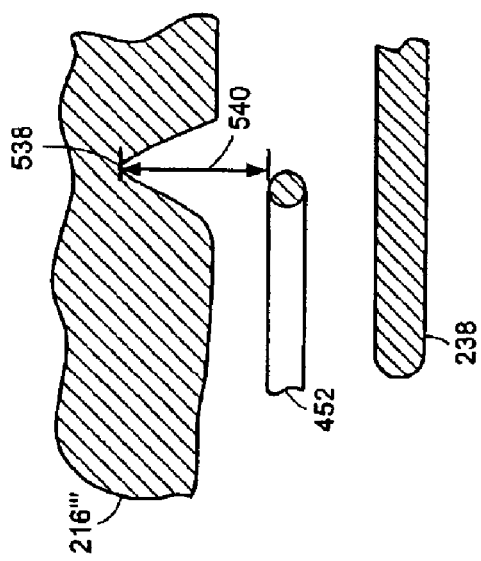

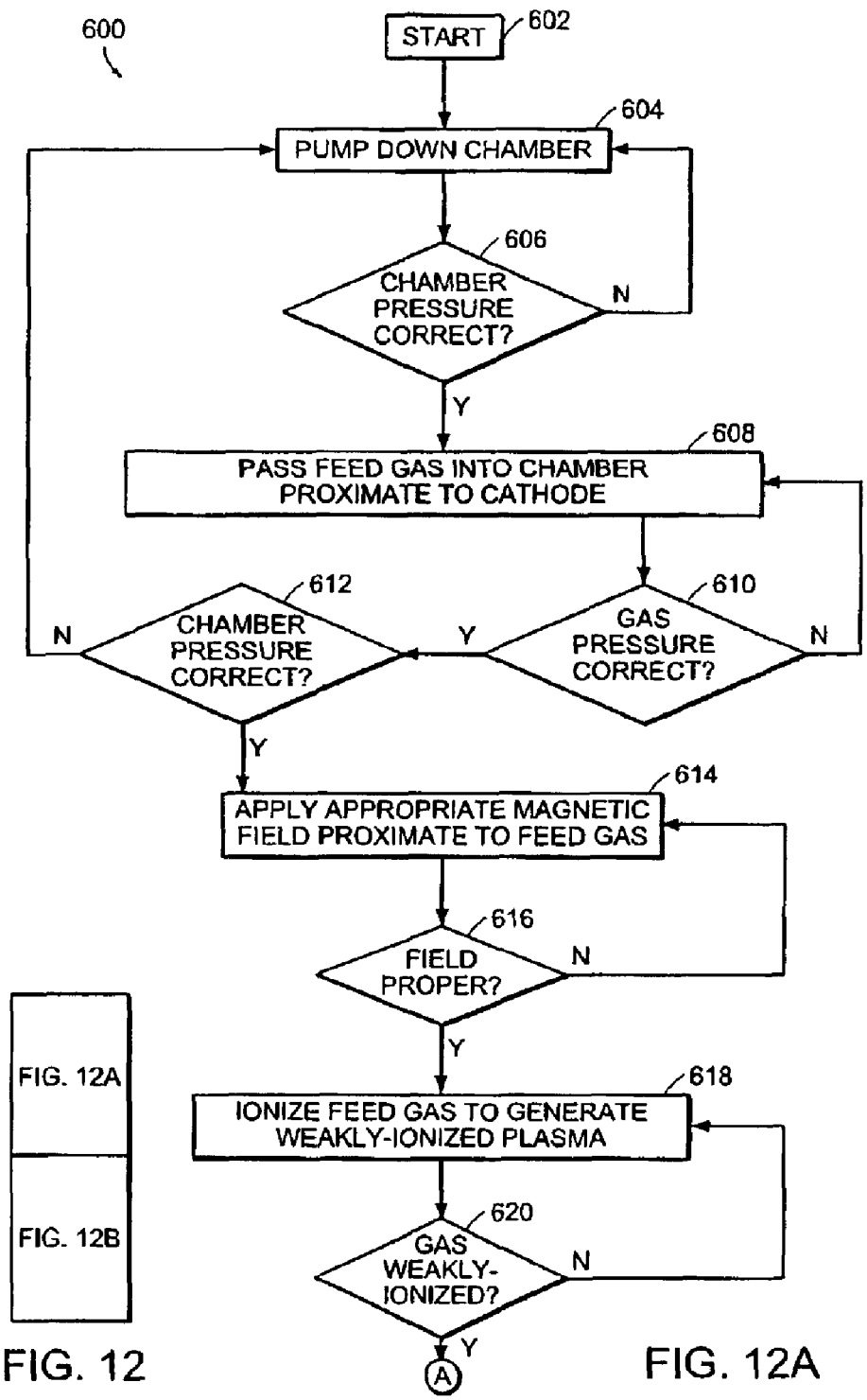

HIGH-POWER PULSED MAGNETICALLY ENHANCED PLASMA PROCESSING

BACKGROUND OF INVENTION

Plasma processes are widely used in many industries, such as the semiconductor manufacturing industry. For example, plasma etching is widely used in the semiconductor manufacturing industry. There are four basic types of plasma etching processes that are used to remove material from surfaces: sputter etching, pure chemical etching, ion energy driven etching, and ion inhibitor etching.

Sputter etching is the ejection of atoms from the surface of a substrate due to energetic ion bombardment. Pure chemical etching uses a plasma discharge to supply gas-phase etchant atoms or molecules that chemically react with the surface of a substrate to form gas-phase products. Ion-enhanced energy driven etching uses a plasma discharge to supply both etchant and energetic ions to a surface of a substrate. Ion inhibitor etching uses a discharge to provide etchant, energetic ions, and inhibitor precursor molecules that deposit on the substrate to form a protective layer film. It is desirably to increase the uniformity and etch rate of known sputter etching systems.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 6A through FIG. 6D illustrate various simulated magnetic field distributions proximate to the cathode for various electron E×B drift currents according to the present invention.

FIG. 9A through FIG. 9C are cross-sectional views of various embodiments of cathodes according to the present invention.

DETAILED DESCRIPTION

Figure 1:
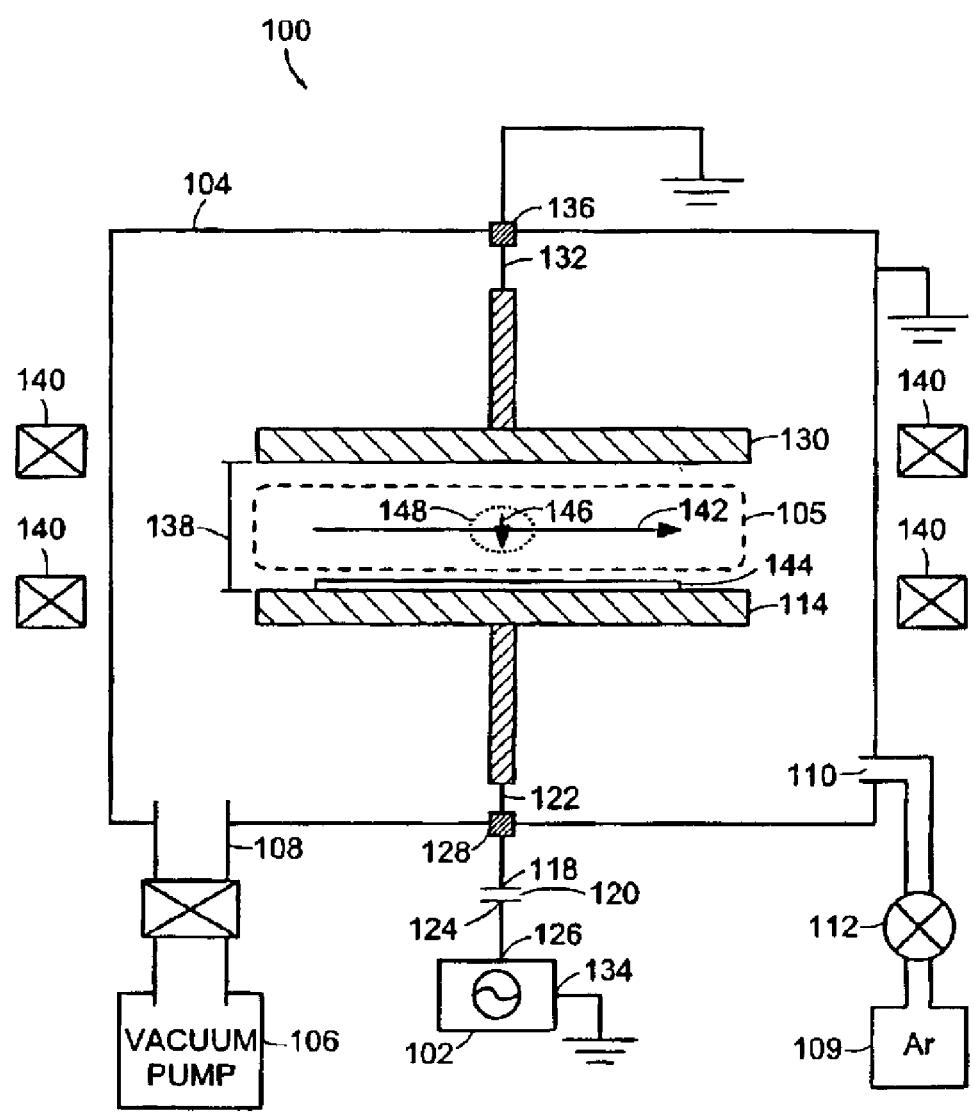
FIG. 1 illustrates a cross-sectional view of a known magnetically enhanced etching apparatus having a having a radio-frequency (RF) power supply.

FIG. 1 illustrates a cross-sectional view of a known magnetically enhanced etching apparatus 100 having a radio-frequency (RF) power supply 102. The known magnetically enhanced etching apparatus 100 includes a vacuum chamber 104 for confining a plasma 105. A vacuum pump 106 is coupled in fluid communication with the vacuum chamber 104 via a conduit 108. The vacuum pump 106 is adapted to evacuate the vacuum chamber 104 to high vacuum and to maintain the chamber at a pressure that is suitable for plasma processing. A gas source 109, such as an argon gas source, introduces gas into the vacuum chamber 104 through a gas inlet 110. A valve 112 controls the gas flow to the chamber 104.

The magnetically enhanced etching apparatus 100 also includes a cathode 114.

The cathode 114 is an electrode that is generally in the shape of a circular disk. The cathode 114 is electrically connected to a first terminal 118 of a blocking capacitor 120 with an electrical transmission line 122. A second terminal 124 of the blocking capacitor 120 is coupled to a first output 126 of the RF power supply 102. The cathode 114 is isolated from the vacuum chamber 104 by an insulator 128 that is used to pass the electrical transmission line 122 through a wall of the vacuum chamber 104.

An anode 130 is positioned in the vacuum chamber 104 opposite the cathode 114. The anode 130 is electrically coupled to ground by an electrical transmission line 132. A second output 134 of the RF power supply 102 is also electrically coupled to ground. An insulator 136 is used to pass the electrical transmission line 132 through a wall of the vacuum chamber 104 in order to isolate the anode 130 from the vacuum chamber 104. The vacuum chamber 104 can also be electrically coupled to ground.

A pair of magnets 140 is positioned outside the chamber 104 to generate a magnetic field 142 in a direction that is substantially parallel to the top surface of the cathode 114. A substrate 144 is disposed on the cathode 114.

In operation, the substrate 144 to be etched is positioned on the cathode 114. The chamber 104 is sufficiently evacuated to high vacuum by the vacuum pump 106. The etching gas from the gas source 109 is introduced into the chamber 104 through the gas inlet 110. The RF power supply 102 applies high-frequency radiation at 13.56 MHz through a blocking capacitor 120 to the cathode 114.

The high-frequency radiation applied to the cathode 114 creates a high-frequency electric field 146 in a direction that is perpendicular to the top surface of the cathode 114. The magnetic field 142 and the high-frequency electric field 146 intersect each other in a region 148 above the substrate 144. Electrons are trapped in the region 148 and collide with neutral atoms from the etching gas. These collisions generate a high-density plasma 105. The negatively biased cathode 114 attracts positively charged ions in the plasma 105 with sufficient acceleration so that the ions etch a surface of the substrate 144.

The RF power applied between the cathode 114 and the anode 130 has sufficient amplitude to ionize the etching gas and create the plasma 105 in the vacuum chamber 104. The plasma consists of positive ions and negative electrons. A typical RF driving voltage is between 500 V and 5000 V, and the distance 138 between the, cathode 114 and the anode 130 is about 70 mm. Typical pressures are in the range 10 m Torr and 100 m Torr. Typical power densities are in the range of 0.1 W/cm$^2$ to 1 W/cm$^2$. Typical plasma densities are $10^9$ cm$^{-3}$–$10^{11}$ cm$^{-3}$, and the electron temperature is on the order of 3 eV.

The ionization process that generates the plasma 105 for sputter etching is sometimes referred to as direct ionization or atomic ionization by electron impact and can be described as follows:

$$Ar + e^- \rightarrow Ar^+ + 2e^-$$

where Ar represents a neutral argon atom in the etching gas and e$^-$ represents an ionizing electron generated in response to the voltage applied between the cathode 114 and the anode 130. The collision between the neutral argon atom and the ionizing electron results in an argon ion (Ar$^+$) and two electrons.

The plasma discharge is maintained by secondary electron emission from the cathode 114. However, typical operating pressures must be relatively high so that the secondary electrons are not lost to the anode 130 or the walls of the chamber 104. These pressures are not optimal for most plasma processes including plasma etching.

The electrons, which cause the ionization, are generally confined by the magnetic fields produced by the magnets 140. The magnetic confinement is strongest in a confinement region 148 where the magnetic field lines are parallel to the surface of the electrode. Generally, a higher concentration of positively charged ions in the plasma is present in the confinement region 148 than elsewhere in the chamber 104. Consequently, the substrate 144 is etched more rapidly in areas directly adjacent to the higher concentration of positively charged ions. The rapid etching in these areas results in undesirable non-uniform etching of the substrate 144.

Dramatically increasing the RF power applied to the plasma alone will not result in the formation of a more uniform and denser plasma that improves the etching uniformity. Improved etching will not occur because the magnetic field will be non-uniform across the electrode and the magnetic field distribution around the electrode will be insufficient to confine the electrons. Furthermore, the amount of applied power that is necessary to achieve a significant increase in uniformity can increase the probability of generating an electrical breakdown condition leading to an undesirable electrical discharge (an electrical arc) in the chamber 104.

Pulsing the direct current (DC) power applied to the plasma can be advantageous since the average discharge power can remain low while relatively large power pulses are periodically applied. In addition, the duration of the voltage pulses can be chosen so as to reduce the probability of establishing an electrical breakdown condition. However, very large power pulses can still result in an electrical breakdown condition regardless of their duration. An undesirable electrical discharge will corrupt the etching process, cause contamination in the vacuum chamber 104, and can damage the substrate and/or any process layers already fabricated. In addition, using a magnetron-type plasma generator results in a magnetic field that significantly improves confinement. The electrons generated in a magnetron-type plasma generator will have a closed-loop path that generates an E×B drift current that significantly improves confinement.

Figure 2:
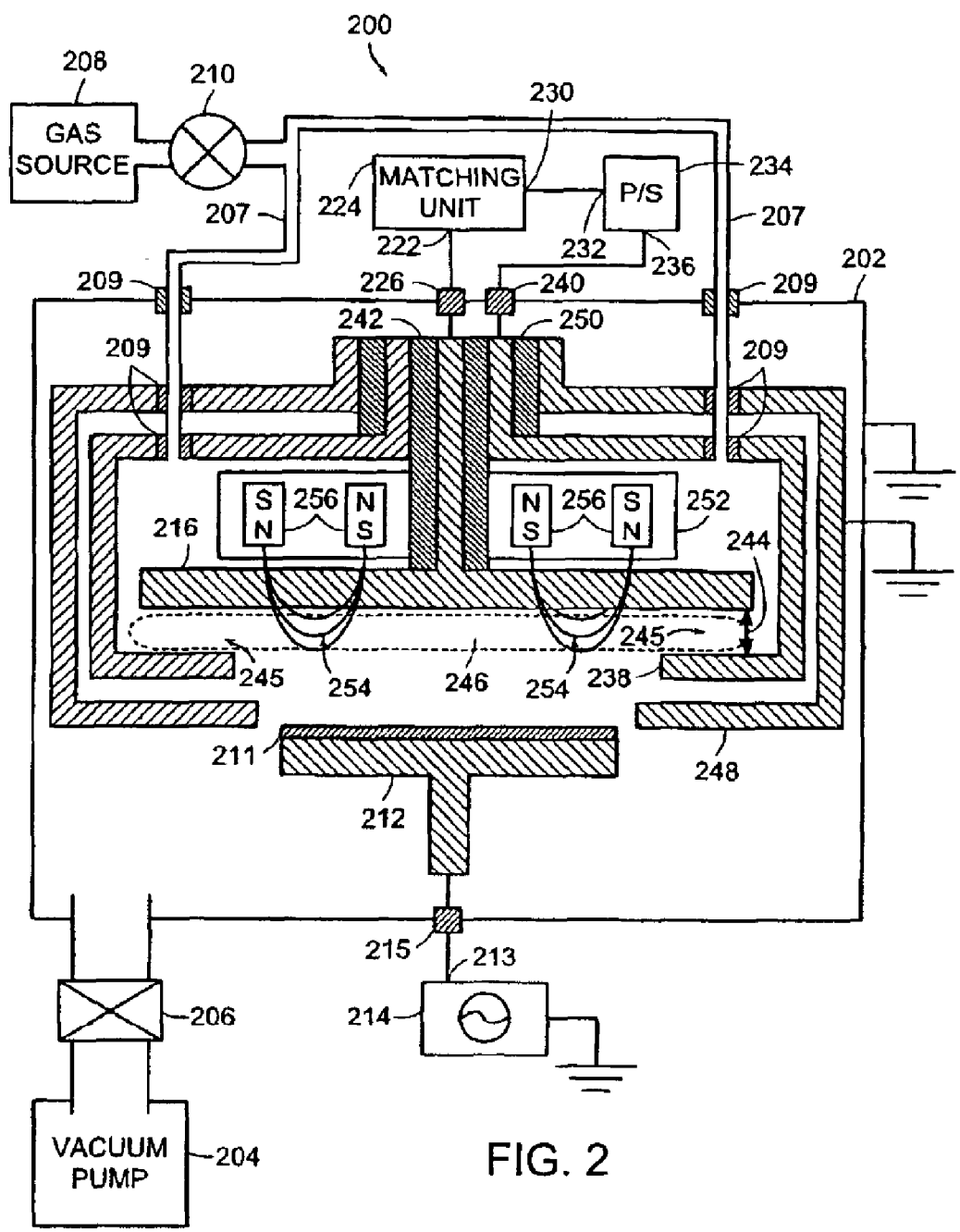
FIG. 2 illustrates a cross-sectional view of an embodiment of a magnetically enhanced plasma processing apparatus according to the present invention.

FIG. 2 illustrates a cross-sectional view of an embodiment of a magnetically enhanced plasma processing apparatus 200 according to the present invention. In one embodiment, the magnetically enhanced plasma processing apparatus 200 can be configured for magnetically enhanced reactive ion etching. In another embodiment, the magnetically enhanced plasma processing apparatus 200 can be configured for sputter etching.

The magnetically enhanced plasma processing apparatus 200 includes a chamber 202, such as a vacuum chamber. The chamber 202 is coupled in fluid communication to a vacuum pump 204 through a vacuum valve 206. In one embodiment, the chamber 202 is electrically coupled to ground potential.

The chamber 202 is coupled to a feed gas source 208 by one or more gas lines 207. In one embodiment, the gas lines 207 are isolated from the chamber and other components by insulators 209. In addition, the gas lines 207 can be isolated from the feed gas source 208 using in-line insulating couplers (not shown). A gas flow control system 210 controls the gas flow to the chamber 202. The gas source 208 can contain any type of feed gas, such as argon. In some embodiments, the feed gas is a mixture of different gases. The different gases can include reactive and non-reactive gases. In one embodiment, the feed gas is a noble gas or a mixture of noble gases.

A substrate 211 to be processed is supported in the chamber 202 by a substrate support 212. The substrate 211 can be any type of work piece such as a semiconductor wafer. In one embodiment, the substrate support 212 is electrically coupled to an output 213 of a bias voltage source 214. An insulator 215 isolates the bias voltage source 214 from the chamber 202. In one embodiment, the bias voltage source 214 is an alternating current (AC) power source, such as a radio frequency (RF) power source. In other embodiments (not shown), the substrate support 212 is coupled to ground potential or is electrically floating.

The magnetically enhanced plasma processing apparatus 200 also includes a cathode 216. In one embodiment, the cathode 216 is formed of a metal. In one embodiment, the cathode 216 is formed of a chemically inert material, such as stainless steel. The distance from the cathode 216 to the substrate 211 can vary from a few centimeters to about one hundred centimeters.

The cathode 216 is coupled to an output 222 of a matching unit 224. An insulator 226 isolates the cathode 216 from a grounded wall of the chamber 202. An input 230 of the matching unit 224 is coupled to a first output 232 of a pulsed power supply 234. A second output 236 of the pulsed power supply 234 is coupled to an anode 238. An insulator 240 isolates the anode 238 from a grounded wall of the chamber 202. Another insulator 242 isolates the anode 238 from the cathode 216.

In one embodiment (not shown), the first output 232 of the pulsed power supply 234 is directly coupled to the cathode 216. In one embodiment (not shown), the second output 236 of the pulsed power supply 234 and the anode 238 are both coupled to ground. In one embodiment (not shown), the first output 232 of the pulsed power supply 234 couples a negative voltage impulse to the cathode 216. In another embodiment (not shown), the second output 236 of the pulsed power supply 234 couples a positive voltage impulse to the anode 238.

In one embodiment, the pulsed power supply 234 generates peak voltage levels that are on the order of 5–10 kV. In one embodiment, operating voltages are between about 50 V and 1000 V. In one embodiment, the pulsed power supply 234 sustains a discharge current level that is between about 1A and about 5,000A depending on the volume of the plasma. Typical operating currents varying from less than about one hundred amperes to more than about a few thousand amperes depending on the volume of the plasma. In one embodiment, the pulses generated by the pulsed power supply 234 have a repetition rate that is below 1 kHz. In one embodiment, the pulse width of the pulses generated by the pulsed power supply 234 is substantially between about one microsecond and several seconds.

The anode 238 is positioned so as to form a gap 244 between the anode 238 and the cathode 216 that is sufficient to allow current to flow through a region 245 between the anode 238 and the cathode 216. In one embodiment, the width of the gap 244 is between approximately 0.3 cm and 10 cm. The surface area of the cathode 216 and the dimensions of the gap determine the volume of the region 245. The dimensions of the gap 244 and the total volume of the region 245 are parameters in the ionization process as described herein.

An anode shield 248 is positioned adjacent to the anode 238 and functions as an electric shield to electrically isolate the anode 238 from the plasma. In one embodiment, the anode shield 248 is coupled to ground potential. An insulator 250 is positioned to isolate the anode shield 248 from the anode 238.

The magnetically enhanced plasma processing apparatus 200 also includes a magnet assembly 252. In one embodiment, the magnet assembly 252 is adapted to create a magnetic field 254 proximate to the cathode 216. The magnet assembly 252 can include permanent magnets 256, or alternatively, electromagnets (not shown). The configuration of the magnet assembly 252 can be varied depending on the desired shape and strength of the magnetic field 254. The magnet assembly 252 can have either a balanced or unbalanced configuration.

In one embodiment, the magnet assembly 252 includes switching electro-magnets, which generate a pulsed magnetic field proximate to the cathode 216. In some embodiments, additional magnet assemblies (not shown) are placed at various locations around and throughout the chamber 202 depending on the plasma process.

In one embodiment, the magnetically enhanced plasma processing apparatus 200 is operated by generating the magnetic field 254 proximate to the cathode 216. In the, embodiment shown in FIG. 2, the permanent magnets 256 continuously generate the magnetic field 254. In other embodiments, electro-magnets (not shown) generate the magnetic field 254 by energizing a current source that is coupled to the electro-magnets. In one embodiment, the strength of the magnetic field 254 is between about 50 and 2000 gauss. After the magnetic field 254 is generated, the feed gas from the gas source 208 is supplied to the chamber 202 by the gas flow control system 210.

In one embodiment, the feed gas is supplied to the chamber 202 directly between the cathode 216 and the anode 238. Directly injecting the feed gas between the cathode 216 and the anode 238 can increase the flow rate of the gas between the cathode 216 and the anode 238. Increasing the flow rate of the gas allows longer duration impulses and thus, can result in the formation higher density plasmas. The flow of the feed gas is discussed further in connection with FIG. 3.

In one embodiment, the pulsed power supply 234 is a component of an ionization source that generates a weakly-ionized plasma. The pulsed power supply 234 applies a voltage pulse between the cathode 216 and the anode 238. In one embodiment, the pulsed power supply 234 applies a negative voltage pulse to the cathode 216. The amplitude and shape of the voltage pulse are chosen such that a weakly-ionized plasma is generated in the region 246 between the anode 238 and the cathode 216.

The weakly-ionized plasma is also referred to as a pre-ionized plasma. In one embodiment, the peak plasma density of the pre-ionized plasma is between about $10^6$ and $10^{12}$ cm$^{-3}$ for argon feed gas. In one embodiment, the pressure in the chamber varies from about $10^{-3}$ to 10 Torr. The peak plasma density of the pre-ionized plasma depends on the properties of the specific plasma processing system.

In one embodiment, the pulsed power supply 234 generates a low power pulse having an initial voltage of between about 100 V and 5 kV with a discharge current of between about 0.1A and 100A in order to generate the weakly-ionized plasma. In some embodiments the width of the pulse can be in on the order of about 0.1 microseconds to about one hundred seconds. Specific parameters of the pulse are discussed herein in more detail.

In one embodiment, the pulsed power supply 234 applies a voltage between the cathode 216 and the anode 238 before the feed gas is supplied between the cathode 216 and the anode 238. In another embodiment, the pulsed power supply 234 applies a voltage between the cathode 216 and the anode 238 after the feed gas is supplied between the cathode 216 and the anode 238.

In one embodiment, a direct current (DC) power supply (not shown) is used to generate and maintain the weakly-ionized or pre-ionized plasma. In this embodiment, the DC power supply is adapted to generate a voltage that is large enough to ignite the pre-ionized plasma. In one embodiment, the DC power supply generates an initial voltage of several kilovolts between the cathode 216 and the anode 238 in order to generate and maintain the pre-ionized plasma. The initial voltage between the cathode 216 and the anode 238 creates a plasma discharge voltage that is on the order of 100–1000 V with a discharge current that is on the order of 0.1 A–100 A.

The direct current required to generate and maintain the pre-ionized plasma is a function of the volume of the plasma. In addition, the current required to generate and maintain the pre-ionized plasma is a function of the strength of the magnetic field in the region 245. For example, in one embodiment, the DC power supply generates a current that is between about 1 mA and 100 A depending on the volume of the plasma and the strength of the magnetic field in the region 245. The DC power supply can be adapted to generate and maintain an initial peak voltage between the cathode 216 and the anode 238 before the introduction of the feed gas.

In another embodiment, an alternating current (AC) power supply (not shown) is used to generate and maintain the weakly-ionized or pre-ionized plasma. For example, the weakly-ionized or pre-ionized plasma can be generated and maintained using electron cyclotron resonance (ECR), capacitively coupled plasma discharge (CCP), or inductively coupled plasma (ICP) discharge. An AC power supply can require less power to generate and maintain a weakly-ionized plasma than a DC power supply. In addition, the pre-ionized or weakly-ionized plasma can be generated by numerous other techniques, such as UV radiation techniques, X-ray techniques, electron beam techniques, ion beam techniques, or ionizing filament techniques. In some embodiments, the weakly-ionized plasma is formed outside of the region 245 and then diffuses into the region, 245.

Forming a weakly-ionized or pre-ionized plasma substantially eliminates the probability of establishing a breakdown condition in the chamber 202 when high-power pulses are applied between the cathode 216 and the anode 238. Uniformly distributing the weakly-ionized or pre-ionized plasma over the cathode area results in a more uniform strongly ionized plasma when a high power pulse is applied. The probability of establishing a breakdown condition is substantially eliminated because the weakly-ionized plasma has a low-level of ionization that provides electrical conductivity through the plasma. This conductivity greatly reduces or prevents the possibility of a breakdown condition when high power is applied to the plasma.

Once the weakly-ionized plasma is formed, high-power pulses are then generated between the cathode 216 and the anode 238. In one embodiment, the pulsed power supply 234 generates the high-power pulses. The desired power level of the high-power pulse depends on several factors including the nature of the etch process, desired etch rate, density of the pre-ionized plasma, and the volume of the plasma. In one embodiment, the power level of the high-power pulse is in the range of about 1 kW to about 10 MW.

Each of the high-power pulses are maintained for a predetermined time that, in one embodiment, is about one microsecond to about ten seconds. In one embodiment, the repetition frequency or repetition rate of the high-power pulses is in the range of between about 0.1 Hz to 1 kHz. In order to minimize undesirable substrate heating, the average power generated by the pulsed power supply 234 can be less than one megawatt depending on the volume of the plasma. In one embodiment, the thermal energy in at least one of the cathode 216, the anode 238, and the substrate support 212 is conducted away or dissipated by liquid or gas cooling such as helium cooling (not shown).

The high-power pulses generate a strong electric field between the cathode 216 and the anode 238. This strong electric field is substantially located in the region 245 across the gap 244 between the cathode 216 and the anode 238. In one embodiment, the electric field is a pulsed electric field. In another embodiment, the electric field is a quasi-static electric field. By quasi-static electric field we mean an electric field that has a characteristic time of electric field variation that is much greater than the collision time for electrons with neutral gas particles. Such a time of electric field variation can be on the order of ten seconds. The strength and the position of the strong electric field will be discussed in more detail herein.

The high-power pulses generate a highly-ionized or a strongly-ionized plasma from the weakly-ionized plasma. For example, the discharge current that is formed from this strongly-ionized plasma can be on the order of 5 kA with a discharge voltage that is in the range of 50–500 V for a pressure that is on the order of about 100 m Torr and 10 Torr. In one embodiment, the discharge voltage is chosen to be relatively low so that the probability of sputtering material from the cathode 216 is low.

In one embodiment, the substrate 211 is biased more negatively than the cathode 216. The positively charged ions in the strongly-ionized plasma accelerate towards the substrate 211. The accelerated ions impact a surface of substrate 211, causing the surface of the substrate 211 to be etched. The strongly-ionized plasma of the present invention causes a very uniform and very high etch rate.

In one embodiment of the invention, the ion flux density of the strongly-ionized plasma and the ion energy of the ions in the strongly-ionized plasma are independently controlled. In one embodiment, the ion flux density is controlled by adjusting the power level and the duration of the high-power pulses generated by the pulsed power supply 234. In one embodiment, the ion energy of the ions that strike the substrate 211 and cause the surface of the substrate 211 to be etched is controlled by adjusting the negative substrate bias voltage generated by the bias voltage source 214 (FIG. 2).

In one embodiment, the strongly-ionized plasma tends to diffuse homogenously in the region 246 and, therefore tends to create a more homogeneous plasma volume. The homogenous diffusion results in accelerated ions impacting the surface of the substrate 211 in a more uniform manner than with a conventional plasma etching system. Consequently, the surface of the substrate is etched more uniformly. In one embodiment, this uniformity is achieved without the necessity of rotating the substrate 211 and/or the magnet assembly 252. The physical mechanism responsible for this homogenous diffusion is described with reference to FIG. 6A through FIG. 6D.

Figure 3:
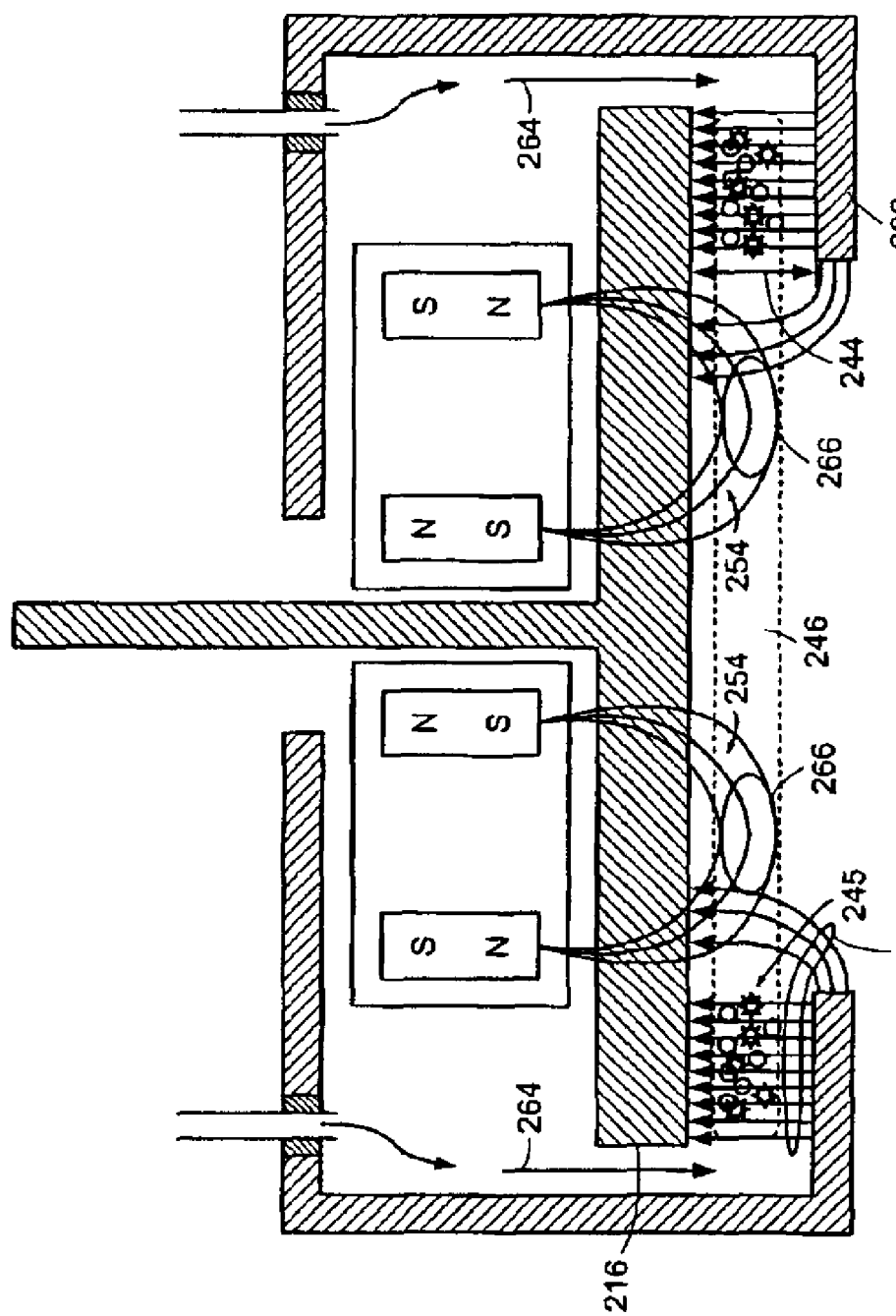
FIG. 3 illustrates a cross-sectional view of the anode and the cathode of the magnetically enhanced plasma processing apparatus of FIG. 2.

FIG. 3 illustrates a cross-sectional view of the cathode 216 and the anode 238 of FIG. 2. In operation, the feed gas 264 flows between the cathode 216 and the anode 238. In one embodiment, the flow of the feed gas 264 is chosen so as to cause a relatively high gas volume exchange in the region 245 between the cathode 216 and the anode 238.

A pre-ionizing voltage is applied between the cathode 216 and the anode 238 across the feed gas 264 and forms the weakly-ionized plasma. The weakly-ionized plasma is generally formed in the region 245 and diffuses to a region 266 as the feed gas 264 continues to flow. In one embodiment (not shown) the magnet assembly 252 is adapted to create a magnetic field 254 in the region 245 that extends to the center of the cathode. Such a magnetic field assists in diffusing the electrons from area 245 to area 266. In another embodiment, the volume of weakly-ionized plasma in the region 245 is rapidly exchanged with a fresh volume of feed gas 264. The electrons in the weakly-ionized plasma are substantially trapped in the region 266 by the magnetic field 254.

A high-power pulse is then applied between the cathode 216 and the anode 238 after the formation of the weakly-ionized plasma in the region 245. This high-power pulse generates the strong electric field 260 in the region 245 between the cathode 216 and the anode 238. The strong electric field 260 causes collisions to occur between neutral atoms, electrons, and ions in the weakly ionized plasma. These collisions generate numerous excited argon atoms in the weakly-ionized plasma. In one embodiment, the cathode 216 and the anode 238 are adapted for sputter etch materials processing.

The accumulation of excited atoms in the weakly-ionized plasma alters the ionization process. In one embodiment, the strong electric field 260 facilitates a multi-step ionization process of an atomic feed gas that significantly increases the rate at which the strongly-ionized plasma is formed. The multi-step ionization processes has an efficiency that increases as the density of excited atoms in the weakly-ionized plasma increases. In another embodiment, the strong electric field 260 enhances the formation of ions of a molecular or atomic feed gas to provide a reactive ion source for reactive ion etching.

In one embodiment, the distance or gap 244 between the cathode 216 and the anode 238 is chosen so as to maximize the rate of excitation of the atoms. The value of the electric field 260 in the region 245 depends on the voltage level applied by the pulsed power supply 234 (FIG. 2) and the dimensions of the gap 244 between the anode 238 and the cathode 216. In some embodiments, the strength of the electric field 260 varies between about 5 V/cm and $10^5$ V/cm depending on various system parameters and operating conditions of the magnetron system.

In some embodiments, the gap 244 can be between about 0.30 cm and about 10 cm depending on various parameters of the process. In one embodiment, the electric field 260 in the region 245 is rapidly applied to the pre-ionized or weakly-ionized plasma. In some embodiments, the rapidly applied electric field 260 is generated by a voltage pulse having a rise time that is between about 0.1 microsecond and ten seconds.

In one embodiment, the dimensions of the gap 244 and the parameters of the applied electric field 260 are chosen to determine the optimum condition for a maximum rate of excitation of the atoms in the region 245. For example, an argon atom requires an energy of about 11.55 eV to become excited. Thus, as the feed gas 264 flows through the region 245, the weakly-ionized plasma is formed and the atoms in the weakly-ionized plasma undergo a stepwise ionization process.

The excited atoms in the weakly-ionized plasma then encounter the electrons that are trapped in the region 266 by the magnetic field 254. Excited atoms only require about 4 eV of energy to ionize while neutral atoms require about 15.76 eV of energy to ionize. Therefore, the excited atoms will ionize at a much higher rate than neutral atoms. In one embodiment, ions in the strongly-ionized plasma strike the cathode 216 causing secondary electron emission from the cathode 216. These secondary electrons are substantially trapped by the magnetic field 254 and interact with any neutral or excited atoms in the strongly-ionized plasma. This process further increases the density of ions in the strongly-ionized plasma as the feed gas 264 is replenished.

The multi-step ionization process corresponding to the rapid application of the electric field 260 can be described as follows:

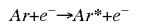

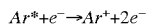

where Ar represents a neutral argon atom in the feed gas and e⁻ represents an ionizing electron generated in response to a pre-ionized plasma, when sufficient voltage is applied between the cathode 216 and the anode 238. Additionally, Ar* represents an excited argon atom in the weakly-ionized plasma. The collision between the excited argon atom and the ionizing electron results in an argon ion (Ar⁺) and two electrons.

The excited argon atoms generally require less energy to become ionized than neutral argon atoms. Thus, the excited atoms tend to more rapidly ionize near the surface of the cathode 216 than the neutral argon atoms. As the density of the excited atoms in the plasma increases, the efficiency of the ionization process rapidly increases. This increased efficiency eventually results in an avalanche-like increase in the density of the strongly-ionized plasma. Under appropriate excitation conditions, the portion of the energy applied to the weakly-ionized plasma that is transformed to the excited atoms is very high for a pulsed discharge in the feed gas.

Thus, in one aspect of the invention, high-power pulses are applied to a weakly-ionized plasma across the gap 244 to generate a strong electric field 260 between the anode 238 and the cathode 216. This strong electric field 260 generates excited atoms in the weakly-ionized plasma. The excited atoms diffuse to the center of the cathode and are rapidly ionized by secondary electrons emitted by the cathode 216. The rapid ionization results in a strongly-ionized plasma having a large ion density that is formed in an area proximate to the cathode 216.

In one embodiment of the invention, a higher density plasma is generated by controlling the flow of the feed gas 264 in the region 245. In this embodiment, a first volume of feed gas 264 is supplied to the region 245. The first volume of feed gas 264 is then ionized to form a weakly-ionized plasma in the region 245. Next, the pulsed power supply 234 (FIG. 2) applies a high power electrical pulse across the weakly-ionized plasma. The high power electrical pulse generates a strongly-ionized plasma from the weakly-ionized plasma.

The level and duration of the high power electrical pulse is limited by the level and duration of the power that the strongly-ionized plasma can absorb before the high power discharge contracts and terminates. In one embodiment, the flow rate of the feed gas 264 is increased so that the strength and the duration of the high-power electrical pulse can be increased in order to increase the density of the strongly-ionized plasma.

In one embodiment, the strongly-ionized plasma is transported through the region 245 by a rapid volume exchange of feed gas 264. As the feed gas 264 moves through the region 245, it interacts with the moving strongly-ionized plasma and also becomes strongly-ionized from the applied high-power electrical pulse. The ionization process can be a combination of direct ionization and/or stepwise ionization as described herein. Transporting the strongly-ionized plasma through the region 245 by a rapid volume exchange of the feed gas 264 increases the level and the duration of the power that can be applied to the strongly-ionized plasma and, thus, generates a higher density strongly-ionized plasma in the region 246.

Figure 4:
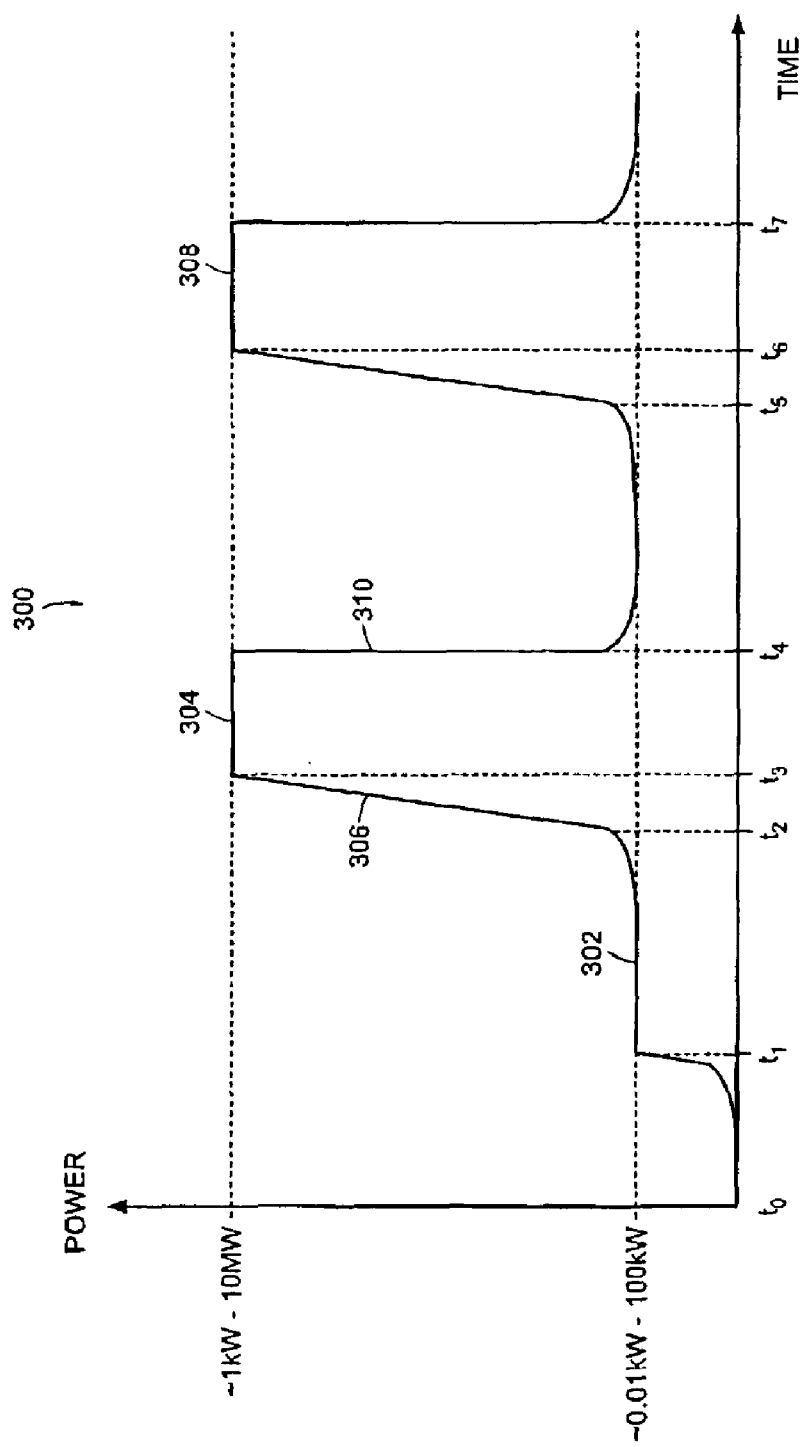
FIG. 4 illustrates a graphical representation of the applied power of a pulse as a function of time for periodic pulses applied to the plasma in the magnetically enhanced plasma processing apparatus of FIG. 2.

FIG. 4 illustrates a graphical representation 300 of the applied power of a pulse as a function of time for periodic pulses applied to the plasma in the magnetically enhanced plasma processing apparatus 200 of FIG. 2. At time $t_0$, the feed gas from the gas source 208 flows into the chamber 202 before the pulsed power supply 234 is activated. The time required for a sufficient quantity of gas to flow from the gas source 208 into the chamber 202 depends on several factors including the flow rate of the gas and the desired pressure in the chamber 202.

In one embodiment (not shown), the pulsed power supply 234 is activated before the feed gas flows into the chamber 202. In this embodiment, the feed gas is injected between the anode 238 and the cathode 216 where it is ignited by the pulsed power supply 234 to generate the weakly-ionized plasma.

In one embodiment, the feed gas flows between the anode 238 and the cathode 216 between time $t_0$ and time $t_1$. At time $t_1$ the pulsed power supply 234 generates a pulse 302 between the cathode 216 and the anode 238 that has a power which is between about 0.01 kW and 100 kW depending on the volume of the plasma. The pulse 302 is sufficient to ignite the feed gas to generate the weakly-ionized plasma.

In one embodiment (not shown), the pulsed power supply 234 applies a potential between the cathode 216 and the anode 238 before the feed gas 264 (FIG. 3) from the gas source 208 is delivered into the chamber 202. In this embodiment, the feed gas 264 is ignited as it flows between the cathode 216 and the anode 238. In other embodiments, the pulsed power supply 234 generates the pulse 302 between the cathode 216 and the anode 238 during or after the feed gas 264 from the gas source 208 is delivered into the chamber 202.

The power generated by the pulsed power supply 234 partially ionizes the gas that is located in the region 245 between the cathode 216 and the anode 238. The partially ionized gas is also referred to as a weakly-ionized plasma or a pre-ionized plasma. As described herein, the formation of the weakly-ionized plasma substantially eliminates the possibility of creating a breakdown condition when high-power pulses are applied to the weakly-ionized plasma.

In one embodiment, the power is continuously applied for between about one microsecond and one hundred seconds to allow the pre-ionized plasma to form and be maintained at a sufficient plasma density. In one embodiment, the power from the pulsed power supply 234 is continuously applied after the weakly-ionized plasma is ignited to maintain the weakly-ionized plasma. The pulsed power supply 234 can be designed so as to output a continuous nominal power in order to generate and sustain the weakly-ionized plasma until a high-power pulse is delivered by the pulsed power supply 234.

Between time $t_2$ and time $t_3$, the pulsed power supply 234 delivers a high-power pulse 304 across the weakly-ionized plasma. In some embodiments, the high-power pulse 304 has a power that is in the range of between about 1 kW and 10 MW depending on parameters of the magnetically enhanced plasma processing apparatus 200. The high-power pulse has a leading edge 306 having a rise time of between about 0.1 microseconds and ten seconds.

The high-power pulse 304 has a power and a pulse width that is sufficient to transform the weakly-ionized plasma to a strongly-ionized plasma. In one embodiment, the high-power pulse 304 is applied for a time that is in the range of between about ten microseconds and ten seconds. At time $t_4$, the high-power pulse 304 is terminated.

The power supply 224 maintains the weakly-ionized plasma after the delivery of the high-power pulse 304 by applying background power that, in one embodiment, is between about 0.01 kW and 100 kW. The background power can be a pulsed or continuously applied power that maintains the pre-ionization condition in the plasma, while the pulsed power supply 234 prepares to deliver another high-power pulse 308.

At time $t_5$, the pulsed power supply 234 delivers another high-power pulse 308. In one embodiment, the repetition rate between the high-power pulses 304, 308 is between about 0.1 Hz and 1 kHz. The particular size, shape, width, and frequency of the high-power pulses 304, 308 depend on various factors including process parameters, the design of the pulsed power supply 234, and the design of the magnetically enhanced plasma processing apparatus. The shape and duration of the leading edge 308 and the trailing edge 310 of the high-power pulse 304 is chosen to sustain the weakly-ionized plasma while controlling the rate of ionization of the strongly-ionized plasma. In one embodiment, the particular size, shape, width, and frequency of the high-power pulse 304 is chosen to control the etch rate of the substrate 211 (FIG. 2).

Figure 5:
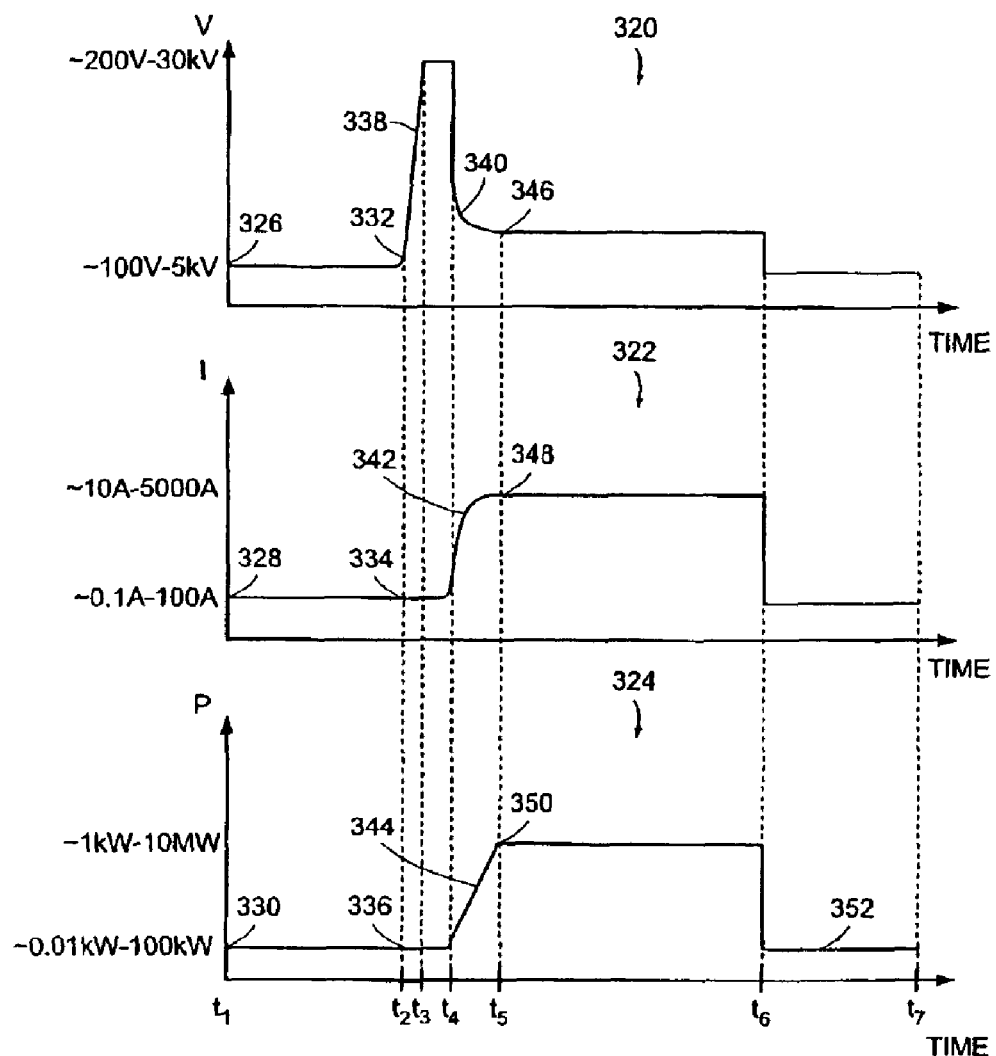
FIG. 5 illustrates graphical representations of the applied voltage, current, and power as a function of time for periodic pulses applied to the plasma in the magnetically enhanced plasma processing apparatus of FIG. 2.

FIG. 5 illustrates graphical representations 320, 322, and 324 of the absolute value of applied voltage, current, and power, respectively, as a function of time for periodic pulses applied to the plasma in the magnetically enhanced plasma processing apparatus 200 of FIG. 2. In one embodiment, at time $t_0$ (not shown), the feed gas 264 (FIG. 3) from the gas source 208 flows into the chamber 202 before the pulsed power supply 234 is activated. The time required for a sufficient quantity of feed gas 264 to flow from the gas source 208 into the chamber 202 depends on several factors including the flow rate of the feed gas 264 and the desired pressure in the chamber 202.

In the embodiment shown in FIG. 5, the power supply 234 generates a constant power at time $t_1$. At time $t_1$, the pulsed power supply 234 generates a voltage 326 across the anode 238 and the cathode 216. In one embodiment, the voltage 326 is approximately between 100 V and 5 kV. The period between time $t_0$ and time $t_1$ (not shown) can be on the order of several microseconds up to several milliseconds. At time $t_1$, the current 328 and the power 330 have constant value.

Between time $t_1$ and time $t_2$, the voltage 326, the current 328, and the power 330 remain constant as the weakly-ionized plasma is generated. The voltage 332 at time $t_2$ is between about 100 V and 5 kV. The current 334 at time $t_2$ is between about 0.1A and 100A. The power 336 delivered at time $t_2$ is between about 0.01 kW and 100 kW.

The power 336 generated by the pulsed power supply 234 partially ionizes the gas that is located between the cathode 216 and the anode 238. The partially ionized gas is also referred to as a weakly-ionized plasma or a pre-ionized plasma. As described herein, the formation of the weakly-ionized plasma substantially eliminates the possibility of creating a breakdown condition when high-power pulses are applied to the weakly-ionized plasma. The suppression of this breakdown condition substantially eliminates the occurrence of undesirable arcing in the chamber 202.

In one embodiment, the period between time $t_1$ and time $t_2$ is between about one microsecond and one hundred seconds to allow the pre-ionized plasma to form and be maintained at a sufficient plasma density. In one embodiment, the power 336 from the pulsed power supply 234 is continuously applied to maintain the weakly-ionized plasma. The pulsed power supply 234 can be designed so as to output a continuous nominal power in order to sustain the weakly-ionized plasma.

Between time $t_2$ and time $t_3$, the pulsed power supply 234 delivers a large voltage pulse 338 across the weakly-ionized plasma. In some embodiments, the large voltage pulse 338 has a voltage that is in the range of 200V to 30 kV. In some embodiments, the period between time $t_2$ and time $t_3$ is between about 0.1 microseconds and ten seconds. The large voltage pulse 338 is applied between time $t_3$ and time $t_4$, before the current across the plasma begins to increase. In one embodiment, the period between time $t_3$ and time $t_4$ can be between about 10 nanoseconds and one microsecond.

Between time $t_4$ and time $t_5$, the voltage 340 drops as the current 342 increases. The power 344 also increases between time $t_4$ and time $t_5$, until a quasi-stationary state exists between the voltage 346 and the current 348. The period between time $t_4$ and time $t_5$ can be on the order of several hundreds of nanoseconds.

In one embodiment, at time $t_5$, the voltage 346 is between about 50V and 1000V, the current 348 is between about 10 A and 5 kA and the power 350 is between about 1 kW and 10 MW. The power 350 is continuously applied to the plasma until time $t_6$. In one embodiment, the period between time $t_5$ and time $t_6$ is approximately between one microsecond and ten seconds.

In one embodiment, the magnetically enhanced plasma processing apparatus is configured for plasma etching. In this embodiment, to substantially prevent sputtering from the cathode 216, the voltage 346 is between about 50 V and 1000 V and the current 348 is between about 1000A and 10,000A at time $t_5$.

The pulsed power supply 234 delivers a high-power pulse having a maximum power 350 and a pulse width that is sufficient to transform the weakly-ionized plasma to a strongly-ionized plasma. At time $t_6$, the maximum power 350 is terminated. In one embodiment, the pulsed power supply 234 continues to supply a background power that is sufficient maintain the plasma after time $t_6$.

In one embodiment, the power supply 224 maintains the plasma after the delivery of the high-power pulse by continuing to apply a power 352 that can be between about 0.01 kW and 100 kW to the plasma. The continuously generated power maintains the pre-ionization condition in the plasma, while the pulsed power supply 234 prepares to deliver the next high-power pulse.

At time $t_7$, the pulsed power supply 234 delivers the next high-power pulse (not shown). In one embodiment, the repetition rate between the high-power pulses is between about 0.1 Hz and 10 kHz. The particular size, shape, width, and frequency of the high-power pulses depend on various factors including process parameters, the design of the pulsed power supply 234, and the design of the magnetically enhanced plasma processing system.

In another embodiment (not shown), the power supply 234 generates a constant voltage. In this embodiment, the voltage 320 is continuously applied from time $t_2$ until time $t_6$. The current 322 and the power 324 rise until time $t_6$ and then remain at a relatively constant level until the voltage 320 is terminated. The increased current and power generate excited atoms.

FIG. 6A through FIG. 6D illustrate various simulated magnetic field distributions 400, 402, 404, and 406 proximate to the cathode 216 for various electron E×B drift currents in the magnetically enhanced plasma processing apparatus 200 of FIG. 2. Plasmas generated by a magnetron have strong diamagnetic properties so the magnetron discharge tends to exclude external magnetic fields from the plasma volume. The simulated magnetic fields distributions 400, 402, 404, and 406 indicate that high-power plasmas having high current density tend to diffuse homogeneously in the area 246 of the magnetically enhanced plasma processing apparatus 200 of FIG. 2.

The high-power pulses between the cathode 216 and the anode 238 generate secondary electrons from the cathode 216 that move in a substantially circular motion proximate to the cathode 216 according to crossed electric and magnetic fields. The substantially circular motion of the electrons generates an electron E×B drift current. The magnitude of the electron E×B drift current is proportional to the magnitude of the discharge current in the plasma and, in one embodiment, is approximately in the range of between about three and ten times the magnitude of the discharge current.

In one embodiment, the substantially circular electron E×B drift current generates a magnetic field that interacts with the magnetic field generated by the magnet assembly 252. In one embodiment, the magnetic field generated by the electron E×B drift current has a direction that is substantially opposite to the magnetic field generated by the magnet assembly 252. The magnitude of the magnetic field generated by the electron E×B drift current increases with increased electron E×B drift current. The homogeneous diffusion of the strongly-ionized plasma in the region 246 is caused, at least in part, by the interaction of the magnetic field generated by the magnet assembly 252 and the magnetic field generated by the electron E×B drift current.

In one embodiment, the electron E×B drift current defines a substantially circular shape for low current density plasma. However, as the current density of the plasma increases, the substantially circular electron E×B drift current tends to describe a more complex shape as the interaction of the magnetic field generated by the magnet assembly 252, the electric field generated by the high-power pulse, and the magnetic field generated by the electron E×B drift current becomes more acute. For example, in one embodiment, the electron E×B drift current has a substantially cycloidal shape. Thus, the exact shape of the electron E×B drift current can be quite elaborate and depends on various factors.

Figure 6A:
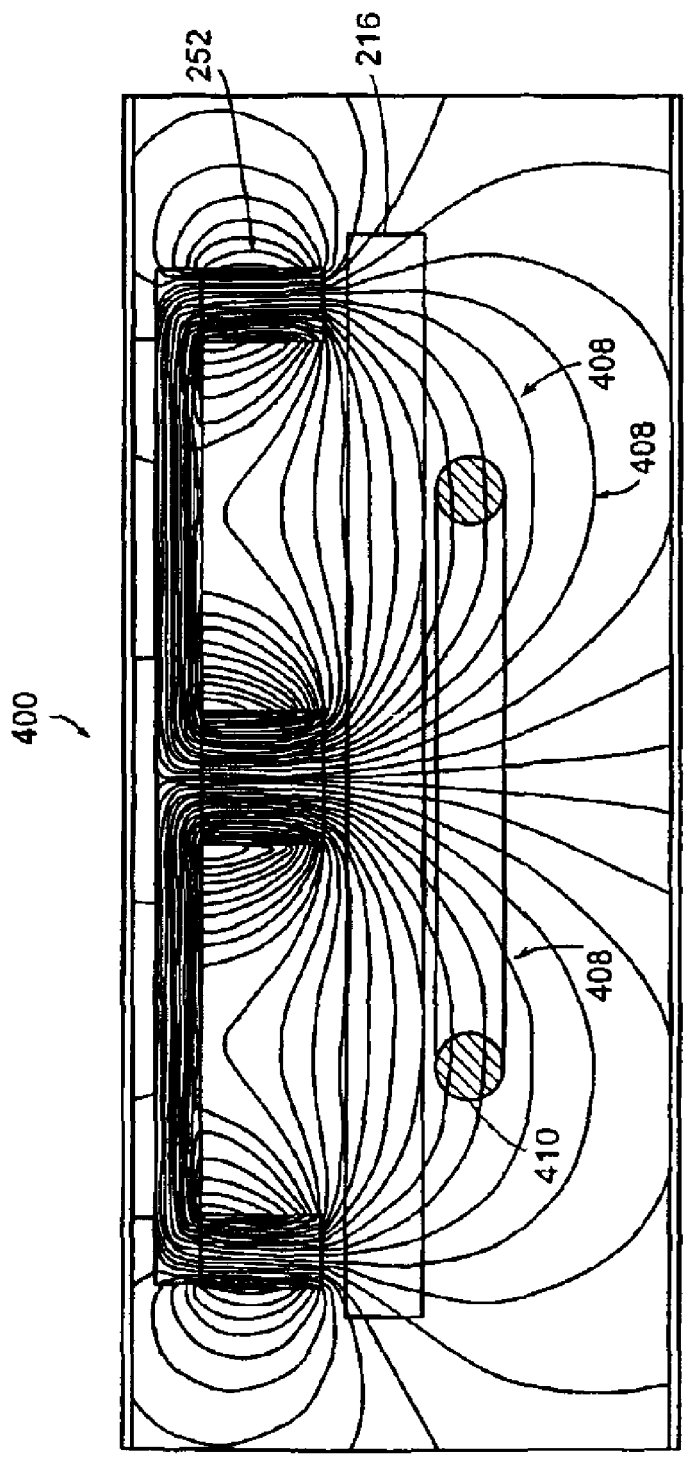

For example, FIG. 6A illustrates the magnetic field lines 408 produced from the interaction of the magnetic field generated by the magnet assembly 252 and the magnetic field generated by an electron E×B drift current 410 illustrated by a substantially circularly shaped ring. The electron E×B drift current 410 is generated proximate to the cathode 216.

In the example shown in FIG. 6A, the electron E×B drift current 410 is approximately one hundred amperes (100A). In one embodiment of the invention, the electron E×B drift current 410 is between approximately three and ten times as great as the discharge current. Thus, in the example shown in FIG. 6A, the discharge current is approximately between 10A and 30A. The magnetic field lines 408 shown in FIG. 6A indicate that the magnetic field generated by the magnet assembly 252 is substantially undisturbed by the relatively small magnetic field that is generated by the relatively small electron E×B drift current 410.

FIG. 6B illustrates the magnetic field lines 412 produced from the interaction of the magnetic field generated by the magnet assembly 252 and the magnetic field generated by an electron E×B drift current 414. The electron E×B drift current 414 is generated proximate to the cathode 216. In the example shown in FIG. 6B, the electron E×B drift current 414 is approximately 300A. Since the electron E×B drift current 414 is typically between about three and ten times as great as the discharge current, the discharge current in this example is approximately between 30A and 100A.

The magnetic field lines 412 that are generated by the magnet assembly 252 are substantially undisturbed by the relatively small magnetic field generated by the relatively small electron E×B drift current 414. However, the magnetic field lines 416 that are closest to the electron E×B drift current 414 are somewhat distorted by the magnetic field generated by the electron E×B drift current 414. The distortion suggests that a larger electron E×B drift current should generate a stronger magnetic field that will interact more strongly with the magnetic field generated by the magnet assembly 252.

FIG. 6C illustrates the magnetic field lines 418 that are produced from the interaction of the magnetic field generated by the magnet assembly 252 and by the magnetic field generated by an electron E×B drift current 420. The electron E×B drift current 420 is generated proximate to the cathode 216. In the example shown in FIG. 6C, the electron E×B drift current 420 is approximately 1,000 A. Since the electron E×B drift current 420 is typically between about three and ten times as great as the discharge current, the discharge current in this example is approximately between 100 A and 300 A.

The magnetic field lines 418 that are generated by the magnet assembly 252 exhibit substantial distortion that is caused by the relatively strong magnetic field generated by the relatively large electron E×B drift current 420. Thus, the larger electron E×B drift current 420 generates a stronger magnetic field that strongly interacts with and can begin to dominate the magnetic field generated by the magnet assembly 252.

The interaction of the magnetic field generated by the magnet assembly 252 and the magnetic field generated by the electron E×B drift current 420 substantially generates magnetic field lines 422 that are somewhat more parallel to the surface of the cathode 216 than the magnetic field lines 408, 412, and 416 in FIG. 6A and FIG. 6B. The magnetic field lines 422 cause the strongly-ionized plasma to more uniformly distribute in the area 246.

Thus, the strongly-ionized plasma is substantially uniformly diffused in the area 246. The cathode 216 is, therefore, bombarded more uniformly by positive ions as compared with conventional magnetically enhanced etching systems. This uniform bombardment generates secondary electrons that are uniformly distributed in the area 246. The secondary electrons uniformly interact with the substantially uniform strongly-ionized plasma. Consequently, the substrate 211 (FIG. 2) is more uniformly etched in a magnetically enhanced plasma etching process according to the invention.

Figure 6D:
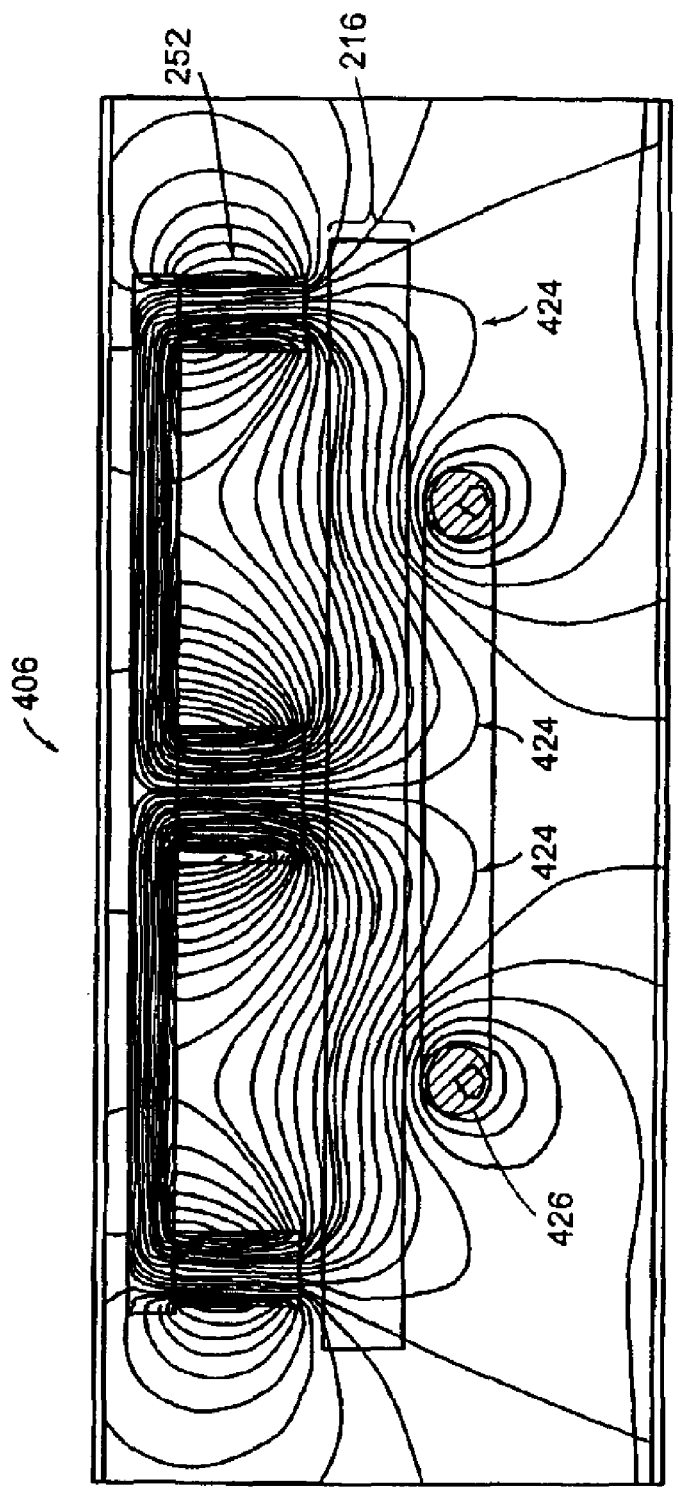

FIG. 6D illustrates the magnetic field lines 424 produced from the interaction of the magnetic field generated by the magnet assembly 252 and the magnetic field generated by an electron E×B drift current 426. The electron E×B drift current 426 is generated proximate to the cathode 216. In the example shown in FIG. 6D, the electron E×B drift current 426 is approximately 5 kA. The discharge current in this example is approximately between 500A and 1,700A.

The magnetic field lines 424 generated by the magnet assembly 252 are relatively distorted due to their interaction with the relatively strong magnetic field generated by the relatively large electron E×B drift current 426. Thus, in this embodiment, the relatively large electron E×B drift current 426 generates a very strong magnetic field that is substantially stronger than the magnetic field generated by the magnet assembly 252.

Figure 7:
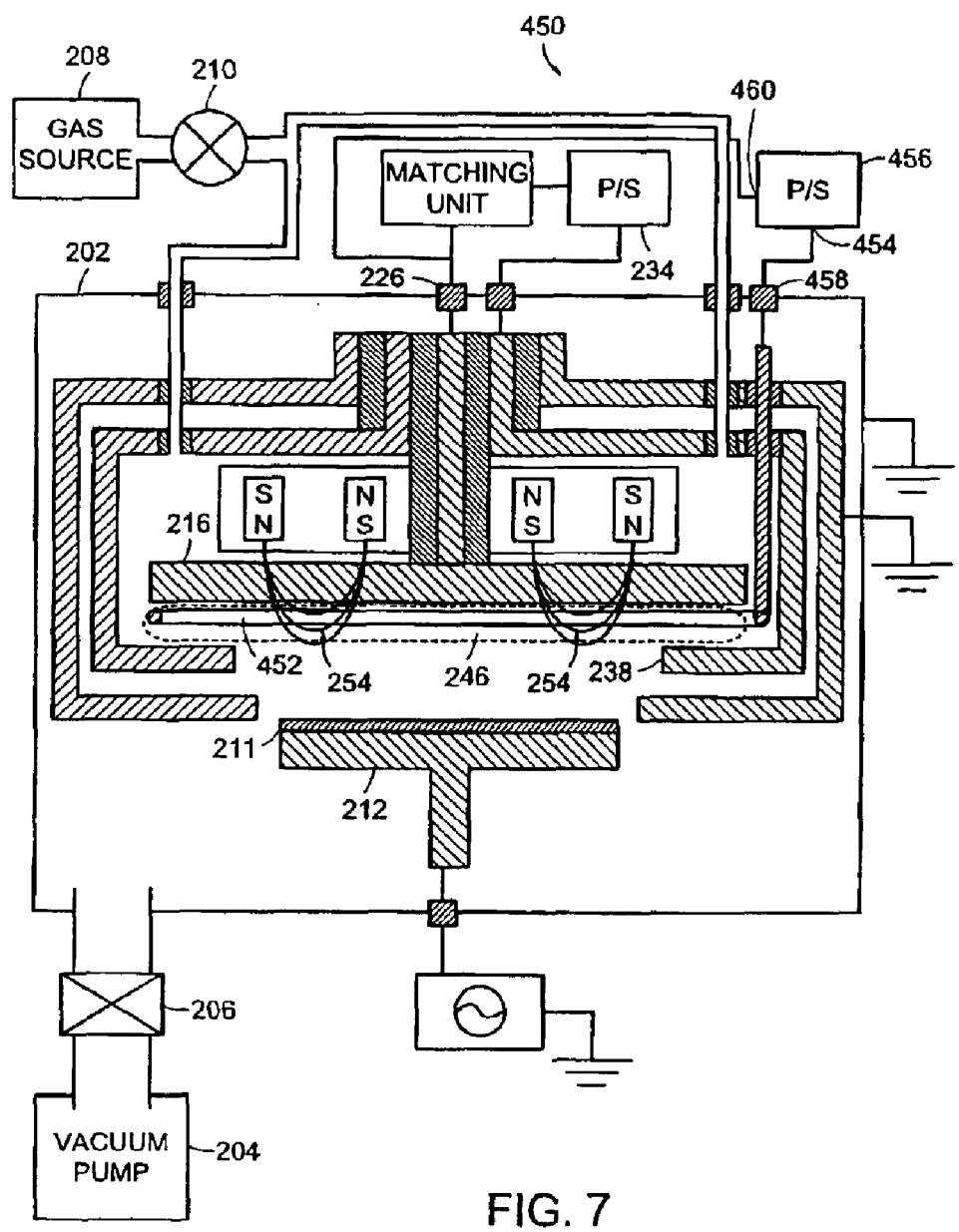
FIG. 7 illustrates a cross-sectional view of another embodiment of a magnetically enhanced plasma processing apparatus according to the present invention.

FIG. 7 illustrates a cross-sectional view of another embodiment of a magnetically enhanced plasma processing apparatus 450 according to the present invention. The magnetically enhanced plasma processing apparatus 450 includes an electrode 452 that generates a weakly-ionized or pre-ionized plasma. The electrode 452 is also referred to as a pre-ionizing filament electrode and is a component in an ionization source that generates the weakly-ionized plasma.

In one embodiment, the electrode 452 is coupled to an output 454 of a power supply 456. The power supply 456 can be a DC power supply or an AC power supply. An insulator 458 isolates the electrode 452 from the grounded wall of the chamber 202. In one embodiment, the electrode 452 is substantially shaped in the form of a ring electrode. In other embodiments, the electrode 452 is substantially shaped in a linear form or any other shape that is suitable for pre-ionizing the plasma.

In one embodiment, a second output 460 of the power supply 456 is coupled to the cathode 216. The insulator 226 isolates the cathode 216 from the grounded wall of the chamber 202. In one embodiment, the power supply 456 generates an average output power that is in the range of between about 0.01 kW and 100 kW. Such an output power is sufficient to generate a suitable current between the electrode 452 and the cathode 216 to pre-ionize the feed gas that is located proximate to the electrode 452.

In operation, the magnetically enhanced plasma processing apparatus 450 functions in a similar manner to the magnetically enhanced plasma processing apparatus 200 of FIG. 2. The magnetic field 254 is generated proximate to the cathode 216. In one embodiment, the strength of the magnetic field 254 is between about fifty and two thousand gauss. The feed gas is supplied from the gas source 208 to the chamber 202 by the gas flow control system 210.

The power supply 456 applies a suitable current between the cathode 216 and the electrode 452. The parameters of the current are chosen to establish a weakly-ionized plasma in the area 246 proximate to the electrode 452. In one embodiment, the power supply 456 generates a voltage that is between about 100 V and 5 kV with a discharge current that is between about 0.1 A and 100A depending on the volume of the plasma. An example of specific parameters of the voltage will be discussed herein in more detail in connection with FIG. 8.

In one embodiment, the resulting pre-ionized plasma density is in the range of between approximately $10^6$ and $10^{12}$ cm$^{-3}$ for argon sputtering gas. In one embodiment, the pressure in the chamber 202 is in the range of approximately $10^{-3}$ to 10 Torr. As previously discussed, the weakly-ionized or pre-ionized plasma substantially eliminates the possibility of establishing a breakdown condition in the chamber 202 when high-power pulses are applied to the plasma.

The pulsed power supply 234 then generates a high-power pulse between the cathode 216 and the anode 238. The high-power pulse generates a strongly-ionized plasma from the weakly-ionized plasma. The parameters of the high-power pulse depend on various parameters including the volume of the plasma, the desired deposition rate, and the concentration of the pre-ionized plasma necessary for etching the substrate 211.

In one embodiment, the high-power pulse between the cathode 216 and the anode 238 is in the range of about 1 kW to about 10 MW. In one embodiment, the discharge current density that can be generated from the strongly-ionized plasma is greater than about 1 A/cm$^2$ for a pressure of approximately 10 m Torr. In one embodiment, the high-power pulse has a pulse width that is in the range of approximately one microsecond to several seconds. In one embodiment, the repetition rate of the high-power discharge is in the range of between about 0.1 Hz to about 10 kHz.

The average power generated by the pulsed power supply can be chosen to minimize undesirable substrate heating. For example, the average power generated by the pulsed power supply can be chosen to be less than one megawatt depending on the volume of the plasma. In one embodiment, the thermal energy in at least one of the cathode 216, the anode 238, and the substrate support 212 can be conducted away or dissipated by liquid or gas cooling (not shown).

The gas flow control system 210 provides a feed gas flow rate that is high enough to maintain the strongly-ionized plasma. Additionally, the vacuum valve 206 controls the pressure so as to maintain the pressure inside the chamber 202 in a range that maintains the strongly-ionized plasma.

The ions in the strongly-ionized plasma accelerate towards the substrate 211 and impact the surface of the substrate 211. The strongly ionized plasma results in a very high etch rate of the substrate material. Furthermore, as described herein in connection with FIG. 6A though FIG. 6D, the strongly-ionized plasma generated by the plasma processing systems according to the present invention tends to diffuse homogenously in the area 246 due to the interaction of generated magnetic fields. The homogenous diffusion results in a more uniform distribution of ions impacting the surface of the substrate 211 compared with conventional plasma etching systems, thereby resulting in relatively uniform etching of the substrate 211.

Figure 8:
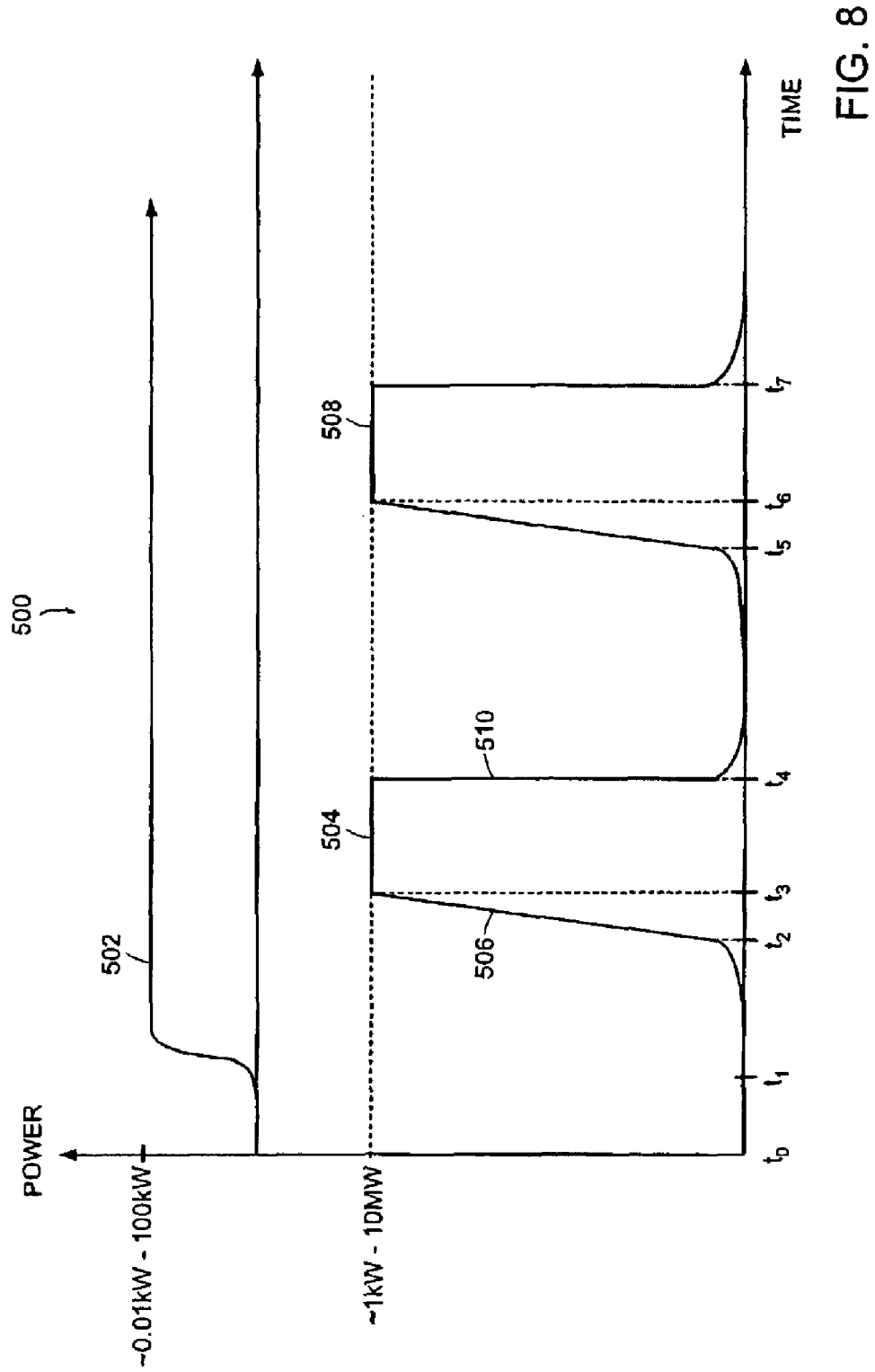
FIG. 8 illustrates a graphical representation of pulse power as a function of time for periodic pulses applied to the plasma in the magnetically enhanced plasma processing apparatus of FIG. 7.

FIG. 8 illustrates a graphical representation 500 of pulse power as a function of time for periodic pulses applied to the plasma in the magnetically enhanced plasma processing system 450 of FIG. 7. In one embodiment, the feed gas from the gas source 208 flows into the chamber 202 at time $t_0$, before either the power supply 456 or the pulsed power supply 234 are activated.

In another embodiment, prior to the formation of the weakly-ionized plasma, the power supply 456 and/or the pulsed power supply 234 are activated at time $t_0$ before the feed gas enters the chamber 202. In this embodiment, the feed gas is injected between the electrode 452 and the cathode 216 where it is ignited by the power supply 456 to generate the weakly-ionized plasma.

The time required for a sufficient quantity of feed gas to flow into the chamber 202 depends on several factors including the flow rate of the feed gas and the desired operating pressure in the chamber 202. At time $t^1$ the power supply 456 generates a power 502 that is in the range of between about 0.01 kW to about 100 kW between the electrode 452 and the cathode 216. The power 502 causes the feed gas proximate to the electrode 452 to become partially ionized, thereby generating a weakly-ionized plasma or a pre-ionized plasma.

At time $t_2$, the pulsed power supply 234 delivers a high-power pulse 504 to the weakly-ionized plasma that is on the order of less than 1 kW to about 10 MW depending on the volume of the plasma. The high-power pulse 504 is sufficient to transform the weakly-ionized plasma to a strongly-ionized plasma. The high-power pulse has a leading edge 506 having a rise time of between about 0.1 microseconds and ten seconds.

In one embodiment, the pulse width of the high-power pulse 504 is in the range of between about one microsecond and ten seconds. The high-power pulse 504 is terminated at time $t_4$. Even after the delivery of the high-power pulse 504, the power 502 from the power supply 456 is continuously applied to sustain the pre-ionized plasma, while the pulsed power supply 234 prepares to deliver another high-power pulse 508. In another embodiment (not shown), the power supply 456 is an AC power supply and delivers suitable power pulses to ignite and sustain the weakly-ionized plasma.

At time $t_5$, the pulsed power supply 234 delivers another high-power pulse 508. In one embodiment, the repetition rate of the high-power pulses is between about 0.1 Hz and 10 kHz. The particular size, shape, width, and frequency of the high-power pulse depend on the process parameters and on the design of the pulsed power supply 234 and the plasma processing system. The shape and duration of the leading edge 506 and the trailing edge 510 of the high-power pulse 504 is chosen to control the rate of ionization of the strongly-ionized plasma. In one embodiment, the particular size, shape, width, and frequency of the high-power pulse 504 is chosen to control the etch rate of the substrate material.

FIG. 9A through FIG. 9C are cross-sectional views of various embodiments of cathodes 216', 216", and 216''' according to the present invention. FIG. 9A through FIG. 9C illustrate one side (the right side with reference to FIG. 7) of each cathode 21 6', 216", and 216'''. The left side of each cathode 216', 216", and 216''' is generally symmetrical to the illustrated right side. FIG. 9A through FIG. 9C illustrate various configurations of the electrode 452 and the cathodes 216', 216", and 216'''. These various configurations can affect the parameters of the electric field generated between the electrode 452 and each of the cathodes 216', 216", and 216'''.

The parameters of the electric field can influence the ignition of the pre-ionized plasma as well as the pre-ionization process generally. In one embodiment, these various embodiments create the necessary conditions for breakdown of the feed gas and ignition of the weakly-ionized plasma in the region between the anode 238 and each respective cathode 216', 216", and 216'''.

FIG. 9A illustrates one side of the cathode 216'. The surface 518 of the cathode 216' is substantially parallel to the ring-shaped electrode 452 and extends past the bend 520 of the ring-shaped electrode 452. In this embodiment, the electric field lines (not shown) from the electric field generated between the cathode 216' and the ring-shaped electrode 452 are substantially perpendicular to the cathode 216' along the circumference of the ring-shaped electrode 452. This embodiment can increase the efficiency of the pre-ionization process.

FIG. 9B illustrates one side of the cathode 216". In this embodiment, the electric field lines (not shown) generated between the cathode 216" and the electrode 452 are substantially perpendicular to the cathode 216" at the point 528 on the cathode 216". The electric field in the gap 530 between the electrode 452 and the cathode 216" is adapted to ignite the plasma from the feed gas flowing through the gap 530. Depending on various parameters, such as where the magnetic field is generated relative to the point 528 and the pressure in the area proximate to the cathode 216", this embodiment can increase the efficiency of the pre-ionization process.

FIG. 9C illustrates one side of the cathode 216'''. In this embodiment, the electric field lines (not shown) generated between the cathode 216''' and the electrode 452 are substantially perpendicular to the cathode 216''' at the point 538. The electric field in the gap 540 between the electrode 452 and the cathode 216''' is adapted to ignite the plasma from the feed gas flowing through the gap 540. This embodiment can increase the efficiency of the pre-ionization process depending on various parameters, such as where the magnetic field is generated relative to the point 538 and the pressure in the area proximate to the cathode 216'''.

Figure 10:
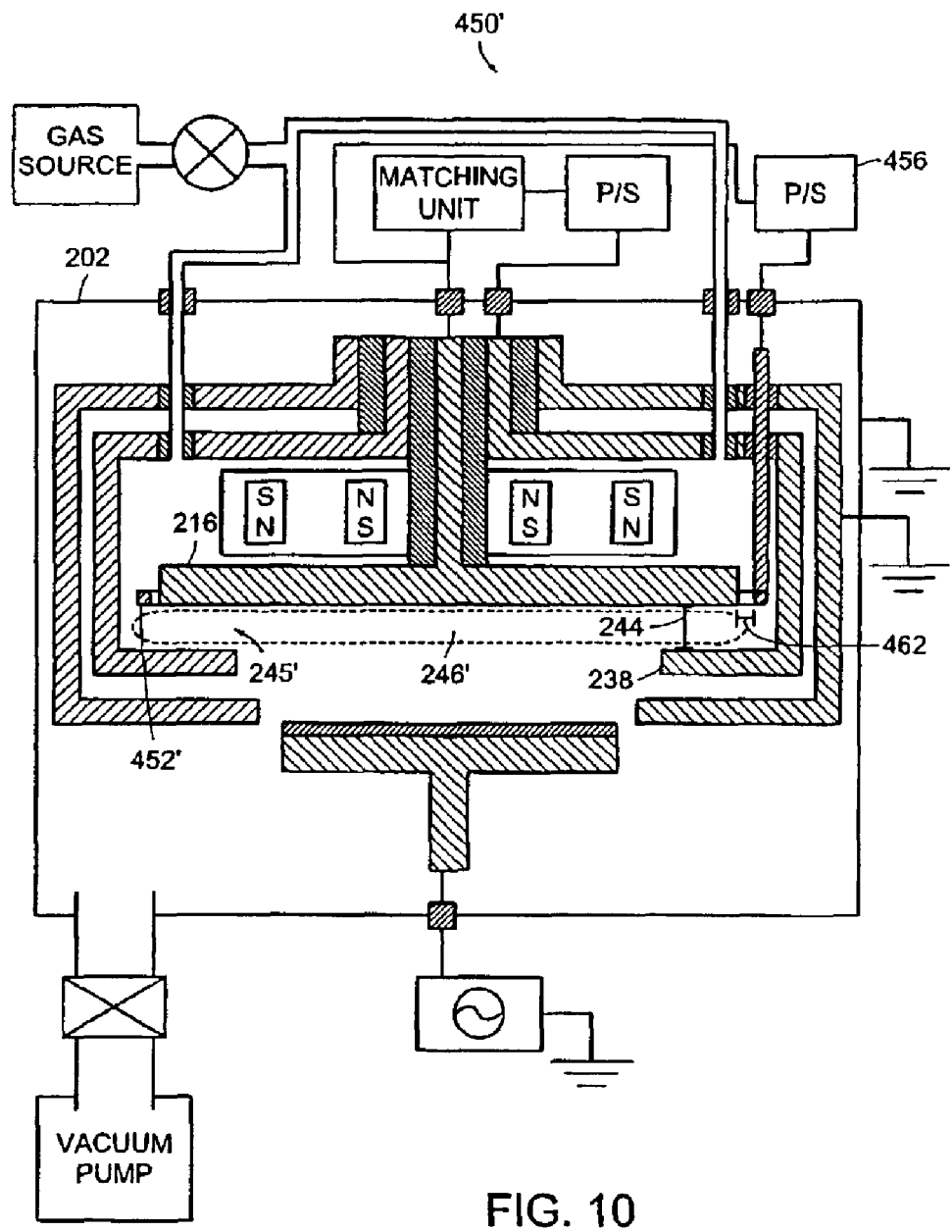
FIG. 10 illustrates a cross-sectional view of another illustrative embodiment of a magnetically enhanced plasma processing apparatus according to the present invention.

FIG. 10 is a cross-sectional view of another embodiment of a magnetically enhanced plasma processing apparatus 450' according to the present invention. This embodiment is similar to the magnetically enhanced plasma processing apparatus 450 of FIG. 7. However, in this embodiment, the electrode 452', which is a component of the ionization source, substantially surrounds the cathode 216.

The position of the electrode 452' relative to the cathode 216 is chosen to achieve particular electrical conditions in the gap 244 between the anode 238 and the cathode 216. For example, in this embodiment, since the pre-ionizing electrode 452' is not physically located in the region 245' between the anode 238 and the cathode 216, it does not interfere with the strong electric field that results when a high-power pulse is applied between the anode 238 and the cathode 216. Additionally, the location of the pre-ionizing electrode 452' results in a more uniformly distributed weakly-ionized plasma in the region 246'.

The power supply 456 applies a substantially constant voltage between the cathode 216 and the electrode 452'. The substantially constant voltage generates a weakly-ionized or pre-ionized plasma proximate to the electrode 452' and the cathode 216. The pre-ionized plasma substantially eliminates the possibility of establishing a breakdown condition in the chamber 202 when high-power pulses are applied to the plasma.

In one embodiment, the power supply 456 is a DC power supply that generates a DC voltage that is in the range of between about 100 V and 5kV with a discharge current that is in the range of between about 0.1 A and 100 A. In another embodiment, the power supply 456 is an AC power supply that generates voltage pulses between the cathode 216 and the electrode 452'.

Since the electrode 452' substantially surrounds the cathode 216, a distance 462 between the electrode 452' and the cathode 216 can be varied by changing the diameter of the electrode 452'. For example, the distance 462 can be varied from about 0.3 cm to about 10 cm. The distance 462 is chosen to maintain the weakly-ionized plasma in the region 246'. The vertical position of the electrode 452' relative to the cathode 216 can also be varied.

The pulsed power supply 234 generates a high-power pulse between the cathode 216 and the anode 238 as described herein. The high-power pulse generates a strongly-ionized plasma from the weakly-ionized plasma.

Figure 11:
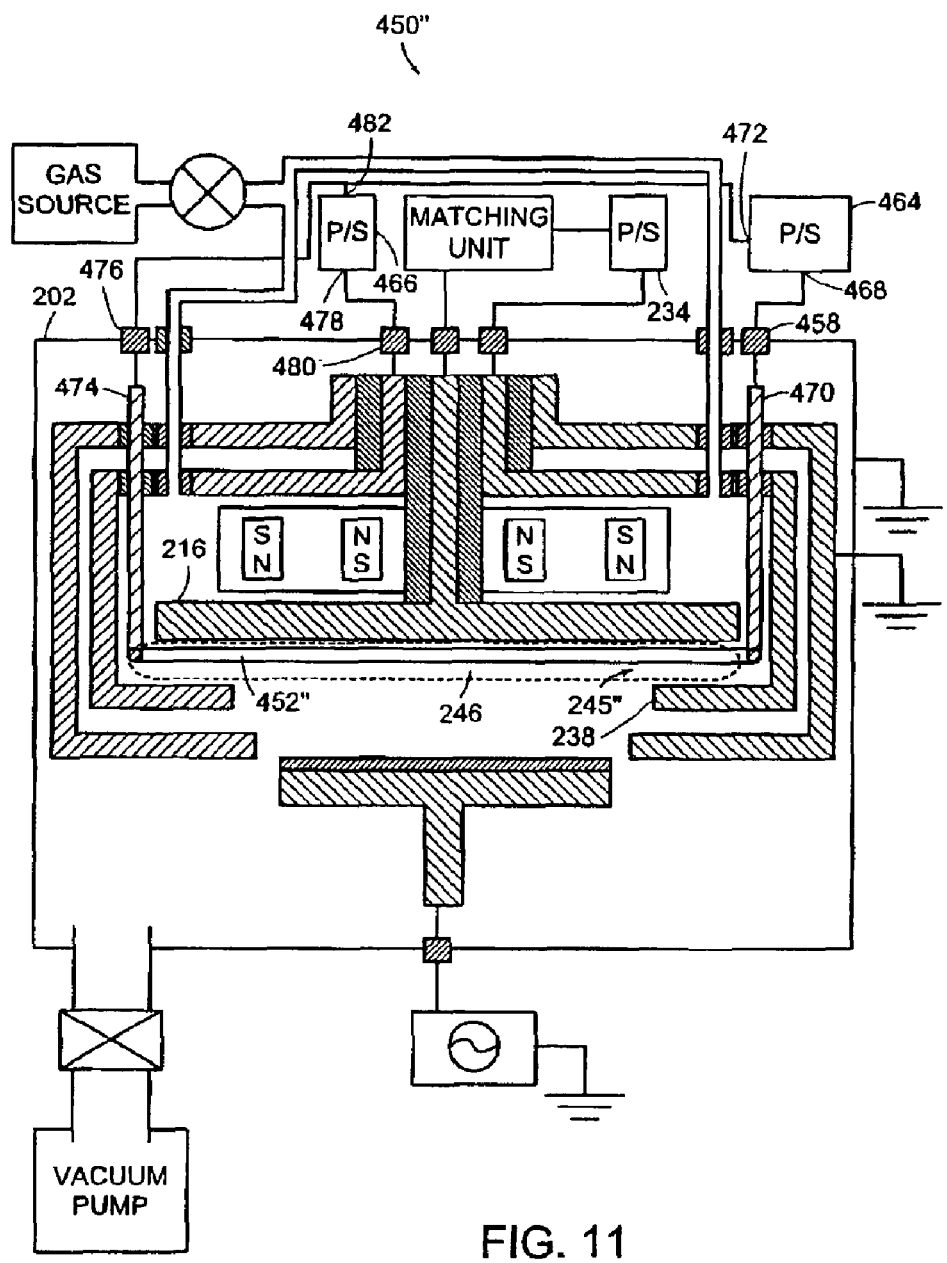
FIG. 11 is a cross-sectional view of another illustrative embodiment of a magnetically enhanced plasma processing apparatus according to the present invention.

FIG. 11 illustrates a cross-sectional view of another illustrative embodiment of a magnetically enhanced plasma processing apparatus 450" according to the present invention. The magnetically enhanced plasma processing apparatus 450" is similar to the magnetically enhanced plasma processing apparatus 450 of FIG. 7. For example, the electrode 452" is a component of an ionization source. However, the electrode 452" is coupled to a first power supply 464 and also to an additional second power supply 466. The position of the electrode 452" relative to the cathode 216 is chosen to achieve particular plasma processing characteristics.

A first output 468 of the first power supply 464 is coupled through the insulator 458 to a first side 470 of the electrode 452". A second output 472 of the first power supply 464 is coupled to a second side 474 of the electrode 452" through an insulator. 476. The first power supply 464 is adapted to generate a current through the electrode 452". The current essentially generates heat in the electrode 452" and the heated electrode 452" emits electrons into the area 245". In one embodiment, the first power supply 464 is a DC power supply and applies a substantially constant current through the electrode 452". In another embodiment, the first power supply 464 is an AC power supply.

A first output 478 of the second power supply 466 is coupled to the anode 238 through an insulator 480. A second output 482 of the second power supply 466 is coupled to the second side 474 of the electrode 452". The second power supply 466 is adapted to apply a voltage between the electrode 452" and the anode 238. The second power supply 466 can be an AC power supply or a DC power supply. In one embodiment, the second power supply 466 generates a voltage in the range of about between 100V and 5 kV with a discharge current that is in the range of between about 0.1A and 100A.

In one embodiment, the second power supply 466 applies a substantially constant voltage that generates a weakly-ionized or pre-ionized plasma proximate to the electrode 452" and the cathode 216. The pre-ionized plasma substantially eliminates the possibility of establishing a breakdown condition in the chamber 202 when high-power pulses are applied to the plasma.

The high-power pulsed power supply 234 then generates a high-power pulse between the cathode 216 and the anode 238. The high-power pulse generates a strongly-ionized plasma from the weakly-ionized plasma. The parameters of the high-power pulse depend on various parameters including the volume of the plasma, the desired etch rate, and the desired concentration of the pre-ionized plasma as described.

Figure 12B:
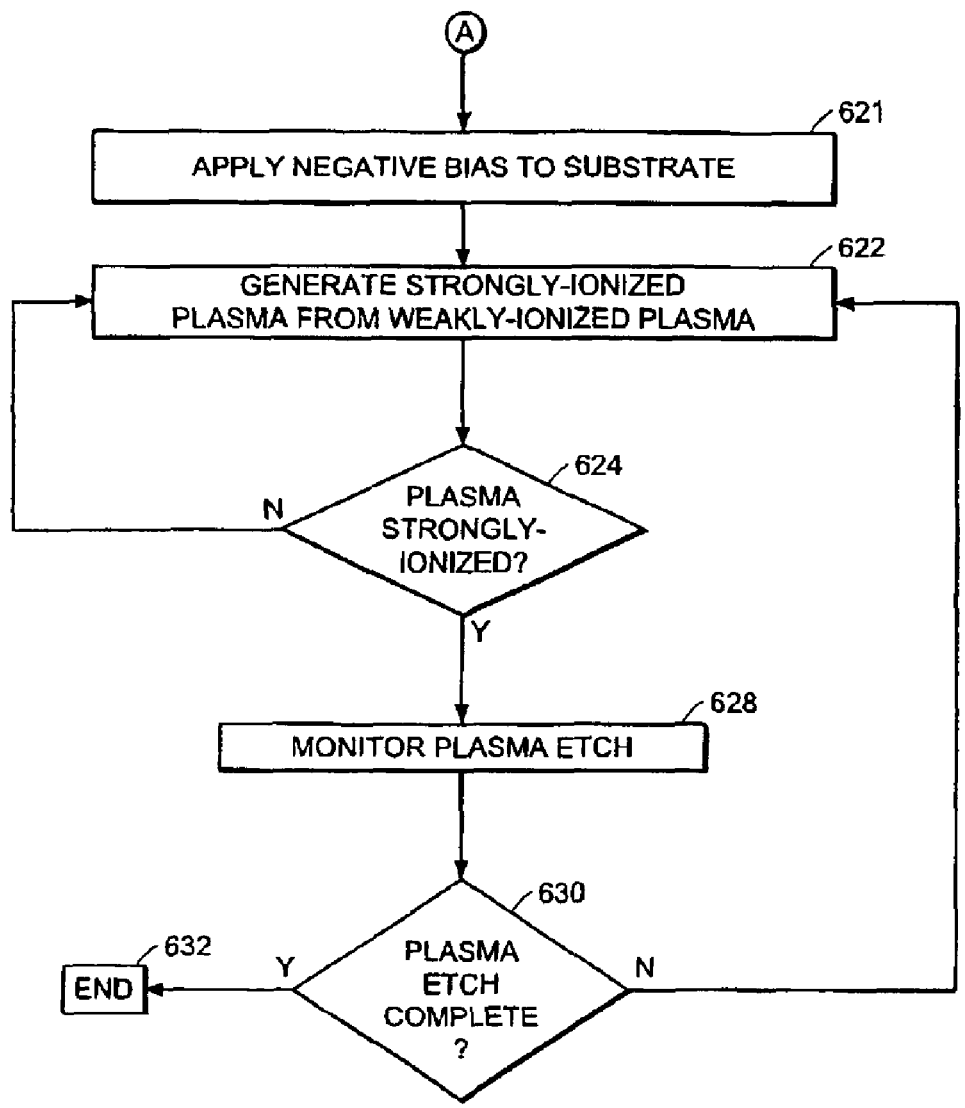
FIG. 12 is a flowchart of an illustrative process for magnetically enhanced plasma etching according to the present invention.

FIG. 12 is a flowchart 600 of an illustrative process for magnetically enhanced plasma etching according to the present invention. The process is initiated (step 602) by activating various systems in the magnetically enhanced plasma processing apparatus 200 of FIG. 2. For example, the chamber 202 is initially pumped down to a specific pressure (step 604). Next, the pressure in the chamber 202 is evaluated (step 606). In one embodiment, feed gas is then pumped into the chamber (step 608).

The gas pressure is then evaluated (step 610). If the gas pressure is correct, the pressure in the chamber 202 is again evaluated (step 612). If the pressure in the chamber 202 is correct, an appropriate magnetic field is generated proximate to the feed gas (step 614). In one embodiment, the magnet assembly 252 of FIG. 2 includes at least one permanent magnet, and consequently, the magnetic field is generated constantly, even before the process is initiated. In another embodiment, a magnetic assembly (not shown) includes at least one electromagnet, and consequently, the magnetic field is generated only when the electromagnet is operating.

When the magnetic field is appropriate (step 616), the feed gas is ionized to generate a weakly-ionized plasma (step 618). In one embodiment, the weakly-ionized plasma is generated by creating a relatively low current discharge in the gap 244 between the cathode 216 and the anode 238 of FIG. 2. In another embodiment, the weakly-ionized plasma can be generated by creating a relatively low current discharge between the electrode 452 and the cathode 216 of FIG. 7. In yet another embodiment, the electrode 452" is heated to emit electrons proximate to the cathode 216 of FIG. 11. In the embodiment of FIG. 11, a relatively low current discharge is created between the anode 238 and the electrode 452".

In the embodiment shown in FIG. 2, the weakly-ionized plasma is generated by applying a potential across the gap 244 between the cathode 216 and the anode 238 before the introduction of the feed gas. In the embodiment shown in FIG. 7, the weakly-ionized plasma is generated by applying a potential difference between the electrode 452 and the cathode 216 of FIG. 7 before the introduction of the feed gas to generate the weakly-ionized plasma.

If the gas is weakly-ionized (step 620), a negative bias is applied to the substrate (step 621). A strongly-ionized plasma is then generated from the weakly-ionized plasma (step 622). In one embodiment, the strongly-ionized plasma is generated by applying a high-power pulse between the cathode 216 and the anode 238. As previously discussed, the high-power pulse results in the generation of a strong electric field in the gap 244 between the anode 238 and the cathode 216. The strong electric field results in a stepwise ionization process for atomic feed gases and enhanced formation of ions in molecular feed gases that result in a strongly ionized plasma. In one embodiment, the strongly-ionized plasma is substantially homogeneous in the area 246 of FIG. 2. This homogeneity results in substantially uniform etching of the substrate 211.

The substrate 211 attracts ions from the strongly-ionized substantially uniform plasma because the substrate 211 is negatively biased relative to the cathode 216. This causes the ions to bombard the substrate 211 causing etching of the substrate material. In one embodiment, once the strongly-ionized plasma is formed (step 624), the plasma etching is monitored (step 628) by known monitoring techniques. Once the plasma etching is completed (step 630), the plasma etch process is ended (step 632).

Figures 13, 13A:
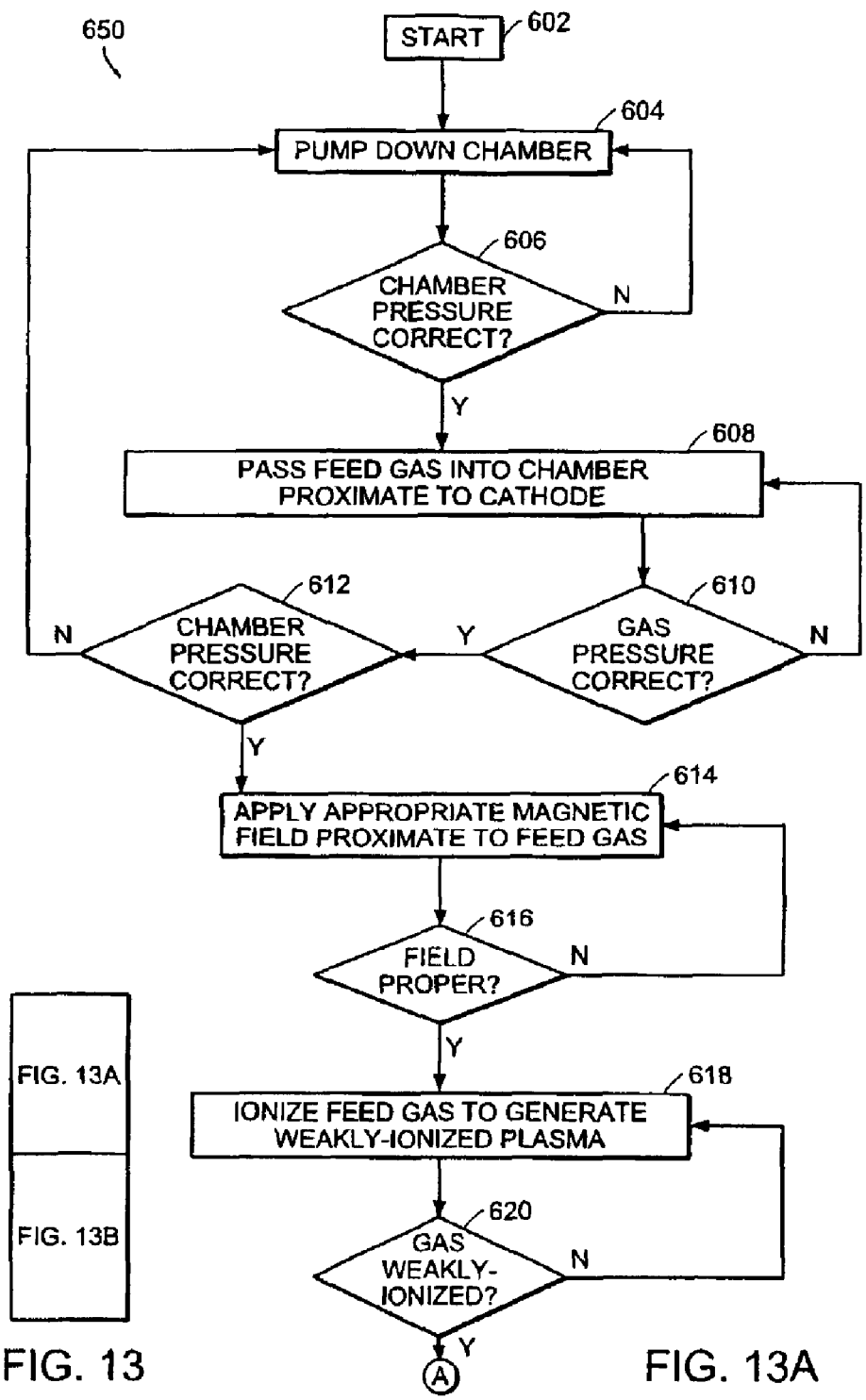
FIG. 13 is a flowchart of an illustrative process for controlling etch rate according to the present invention.
Figure 13B:
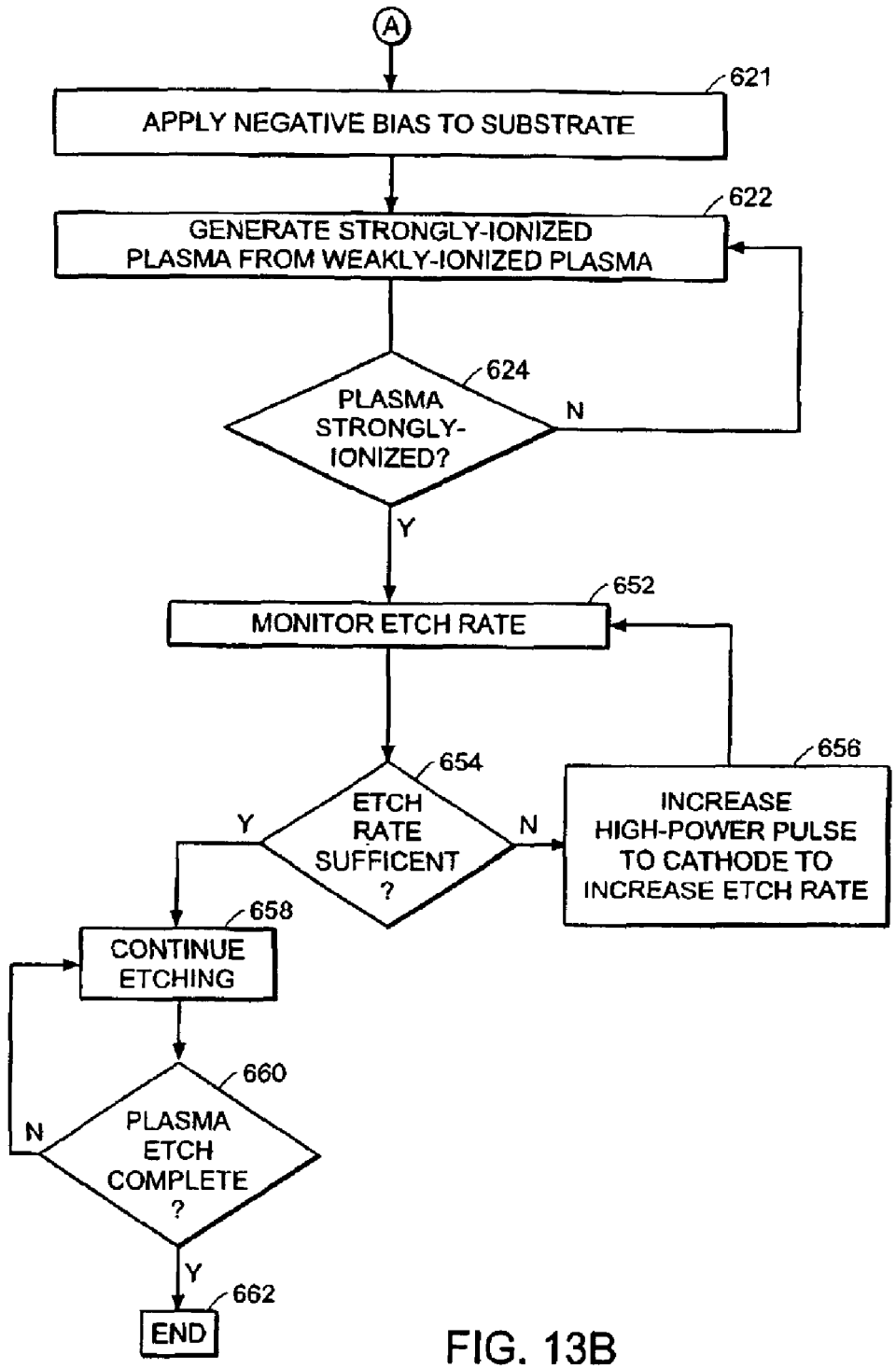

FIG. 13 is a flowchart 650 of an illustrative process for controlling the etch rate according to the present invention. The process is initiated (step 602) by activating various systems in the magnetically enhanced plasma processing apparatus 200 of FIG. 2. For example, the chamber 202 is initially pumped down to a specific pressure (step 604). Next, the pressure in the chamber 202 is evaluated (step 606). In one embodiment, feed gas is then pumped into the chamber (step 608). The gas pressure is evaluated (step 610).

If the gas pressure is correct, the pressure in the chamber 202 is again evaluated (step 612). If the pressure in the chamber 202 is correct, an appropriate magnetic field is generated proximate to the feed gas (step 614).

Assuming that the magnetic field is appropriate (step 61 6), the feed gas is ionized to generate a weakly-ionized plasma (step 618). In one embodiment, the weakly-ionized plasma is generated by creating a relatively low current discharge between the cathode 216 and the anode 238 of FIG. 2.

After the weakly-ionized plasma is generated (step 620), a negative bias is applied to the substrate (step 621). A strongly-ionized plasma is then generated from the weakly-ionized plasma (step 622). In one embodiment, the strongly-ionized plasma is generated by applying a high-power pulse in the gap 244 between the cathode 216 and the anode 238. In one embodiment, the strongly-ionized plasma is substantially homogeneous in the area 246 of FIG. 2. This homogeneity results in more uniform etching of the substrate 211. The substrate 211 attracts ions from the strongly-ionized plasma and the ions bombard the substrate 211 causing etching of the substrate material.

In one embodiment, once the strongly-ionized plasma is formed (step 624), the etch rate is monitored (step 652) by known monitoring techniques. If the etch rate is not sufficient (step 654), the power delivered to the plasma is increased (step 656). In one embodiment, increasing the magnitude of the high-power pulse applied in the gap 244 between the cathode 216 and the anode 238 increases the power delivered to the plasma. In one embodiment (not shown), to control the ion energy of the ions bombarding the substrate, the negative bias applied to the substrate (step 621) is varied. The etch rate is again evaluated (step 652). This process continues until the etch rate is sufficient (step 654), and etching continues (step 658). Once the plasma etch is completed (step 660), the etch process is ended (step 662).

Equivalents

While the invention has been particularly shown and described with reference to specific preferred embodiments, it should be understood by those skilled in the art that various changes in form and detail may be made therein without departing from the spirit and scope of the invention as defined herein.

What is claimed is:

1. A magnetically enhanced plasma processing apparatus comprising:
    an anode;
    a cathode that is positioned adjacent to the anode and forming a gap there between;
    an ionization source that generates a weakly-ionized plasma proximate to the cathode;
    a magnet that is positioned to generate a magnetic field proximate to the weakly-ionized plasma, the magnetic field substantially trapping electrons in the weakly-ionized plasma proximate to the cathode;
    a power supply that produces an electric field across the gap, the electric field generating excited atoms in the weakly-ionized plasma and generating secondary electrons from the cathode, the secondary electrons ionizing the excited atoms, thereby creating a strongly-ionized plasma comprising a plurality of ions; and
    a voltage supply that applies a bias voltage to a substrate that is positioned proximate to the cathode, the bias voltage causing ions in the plurality of ions to impact a surface of the substrate in a manner that causes etching of the surface of the substrate.

2. The apparatus of claim 1 wherein the electric field comprises a quasi-static electric field.

3. The apparatus of claim 1 wherein the electric field comprises a pulsed electric field.

4. The apparatus of claim 1 wherein a rise time of the electric field is chosen to increase an ionization rate of the excited atoms in the weakly-ionized plasma.

5. The apparatus of claim 1 wherein a rise time of the electric field is chosen to increase an etch rate of the surface of the substrate.

6. The apparatus of claim 1 wherein the weakly-ionized plasma reduces the probability of developing an electrical breakdown condition between the anode and the cathode.

7. The apparatus of claim 1 wherein the ions in the plurality of ions impact the surface of the substrate so as to cause substantially uniform etching of the surface of the substrate.

8. The apparatus of claim 1 wherein the ions in the plurality of ions impact the surface of the substrate so as to cause anisotropic etching.

9. The apparatus of claim 1 wherein a volume between the anode and the cathode is chosen to increase an ionization rate of the excited atoms and molecules in the weakly-ionized plasma.

10. The apparatus of claim 1 wherein the ionization source is chosen from the group comprising a UV source, an X-ray source, an electron beam source, an ion beam source, an inductively coupled plasma source, a capacitively coupled plasma source, a microwave plasma source, an electrode, a DC power supply, and an AC power supply.

11. The apparatus of claim 1 wherein the power supply generates an electrical pulse that produces the electric field across the gap.

12. The apparatus of claim 11 wherein at least one of a pulse amplitude and a pulse width of the electrical pulse is selected to increase a rate of etching of the surface of the substrate.

13. The apparatus of claim 1 wherein the bias voltage is selected to control ion energy of the ions in the plurality of ions that impact the surface of the substrate.

14. The apparatus of claim 1 wherein the electric field generates ions and excited atoms in the weakly-ionized plasma and generates secondary electrons from the cathode, the secondary electrons ionizing the excited atoms, excited molecules, neutral atoms and neural molecules, thereby creating the strongly-ionized plasma.

15. A method of magnetically enhanced plasma processing, the method comprising:
    ionizing a feed gas to generate a weakly-ionized plasma proximate to a cathode;
    generating a magnetic field proximate to the weakly-ionized plasma, the magnetic field substantially trapping electrons in the weakly-ionized plasma proximate to the cathode;
    applying an electric field across the weakly-ionized plasma that excites atoms in the weakly-ionized plasma and that generates secondary electrons from the cathode, the secondary electrons ionizing the excited atoms, thereby creating a strongly-ionized plasma comprising a plurality of ions; and
    applying a bias voltage to a substrate that is positioned proximate to the cathode, the bias voltage causing ions in the plurality of ions to impact a surface of the substrate in a manner that causes etching of the surface of the substrate.

16. The method of claim 15 wherein the applying the electric field comprises applying the electric field at a constant power.

17. The method of claim 15 wherein the applying the electric field comprises applying the electric field at a constant voltage.

18. The method of claim 15 wherein the applying the electric field comprises applying a quasi-static electric field.

19. The method of claim 15 wherein the applying the electric field comprises applying an electrical pulse across the weakly-ionized plasma.

20. The method of claim 19 further comprising selecting at least one of a pulse amplitude and a pulse width of the electrical pulse to increase an ionization rate of the strongly-ionized plasma.

21. The method of claim 19 further comprising selecting at least one of a pulse amplitude and a pulse width of the electrical pulse to cause the strongly-ionized plasma to be substantially uniform in an area adjacent to the surface of the substrate.

22. The method of claim 19 further comprising selecting at least one of a pulse amplitude and a pulse width of the electrical pulse to increase a rate of etching of the surface of the substrate.

23. The method of claim 15 wherein ions in the plurality of ions impact the surface of the substrate in a substantially uniform manner.

24. The method of claim 15 wherein the strongly-ionized plasma is substantially uniform proximate to a surface of the substrate.

25. The method of claim 15 wherein the peak plasma density of the weakly-ionized plasma is less than about $10^{12}$ cm$^{-3}$.

26. The method of claim 15 wherein the peak plasma density of the strongly-ionized plasma is greater than about $10^{12}$ cm$^{-3}$.

27. The method of claim 15 further comprising controlling a temperature of the surface of the substrate.

28. The method of claim 15 wherein the ionizing the feed gas comprises exposing the feed gas to at least one of an electric field, a UV source, an X-ray source, an electron beam source, an ion beam source, an inductively coupled plasma source, a capacitively coupled plasma source, a microwave source, a DC power supply, and an AC power supply.

29. The method of claim 15 wherein the bias voltage is selected to control an ion energy of the ions in the plurality of ions that impact the surface of the substrate.

30. A method of magnetically enhanced plasma processing, the method comprising:
  ionizing a volume of feed gas to form a weakly-ionized plasma proximate to a cathode;
  generating a magnetic field proximate to the weakly-ionized plasma, the magnetic field substantially trapping electrons in the weakly-ionized plasma proximate to the cathode;
  applying an electrical pulse across the weakly-ionized plasma to generate a strongly-ionized plasma comprising a first plurality of ions;
  exchanging the strongly-ionized plasma with a second volume of feed gas while applying the electrical pulse across the second volume of feed gas to generate a strongly-ionized plasma comprising a second plurality of ions; and
  applying a bias voltage to a substrate that is positioned proximate to the cathode, the bias voltage causing ions in the first and the second plurality of ions to impact a surface of the substrate in a manner that causes etching of the surface of the substrate.

31. The method of claim 30 wherein the exchanging the strongly-ionized plasma comprises exchanging substantially all of the strongly-ionized plasma with a second volume of feed gas.

32. The method of claim 30 further comprising selecting at least one of a pulse amplitude and a pulse width of the electrical pulse that increases an ionization rate of the strongly-ionized plasma.

33. The method of claim 30 further comprising selecting at least one of a pulse amplitude and a pulse width of the electrical pulse that causes the strongly-ionized plasma to be substantially uniform in an area adjacent to the surface of the substrate.

34. The method of claim 30 further comprising selecting at least one of a pulse amplitude and a pulse width of the electrical pulse to increase a rate of etching of the surface of the substrate.

35. The method of claim 30 wherein the applying the electrical pulse across the weakly-ionized plasma excites atoms in the weakly-ionized plasma and generates secondary electrons from the cathode, the secondary electrons ionizing the excited atoms, thereby creating the strongly-ionized plasma.

36. A magnetically enhanced plasma processing apparatus comprising:
  means for ionizing a feed gas to generate a weakly-ionized plasma proximate to a cathode;
  means for generating a magnetic field proximate to the weakly-ionized plasma, the magnetic field substantially trapping electrons in the weakly-ionized plasma proximate to the cathode;
  means for applying an electric field across the weakly-ionized plasma that excites atoms in the weakly-ionized plasma and that generates secondary electrons from the cathode, the secondary electrons ionizing the excited atoms,
  thereby creating a strongly-ionized plasma comprising a plurality of ions; and
  means for applying a bias voltage to a substrate that is positioned proximate to the cathode, the bias voltage causing ions in the plurality of ions to impact a surface of the substrate in a manner that causes etching of the surface of the substrate.

37. A magnetically enhanced plasma processing apparatus comprising:
  means for ionizing a volume of feed gas to form a weakly-ionized plasma proximate to a cathode;
  means for generating a magnetic field proximate to the weakly-ionized plasma, the magnetic field substantially trapping electrons in the weakly-ionized plasma proximate to the cathode;
  means for applying an electrical pulse across the weakly-ionized plasma to generate a strongly-ionized plasma comprising a first plurality of ions;
  means for exchanging the strongly-ionized plasma with a second volume of feed gas while applying the electrical pulse across the second volume of feed gas to generate a strongly-ionized plasma comprising a second plurality of ions; and
  means for applying a bias voltage to a substrate that is positioned proximate to the cathode, the bias voltage causing ions in the first and the second plurality of ions to impact a surface of the substrate in a manner that causes etching of the surface of the substrate.

* * * * *